(12) United States Patent
Noda

(10) Patent No.: US 9,613,896 B2
(45) Date of Patent: Apr. 4, 2017

(54) SEMICONDUCTOR MEMORY DEVICE WITH CONDUCTIVE COLUMNAR BODY

(71) Applicant: KABUSHIKI KAISHA TOSHIBA, Minato-ku (JP)

(72) Inventor: Kotaro Noda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/730,640

(22) Filed: Jun. 4, 2015

(65) Prior Publication Data
US 2016/0276264 A1   Sep. 22, 2016

Related U.S. Application Data

(60) Provisional application No. 62/134,625, filed on Mar. 18, 2015.

(51) Int. Cl.
| | |
|---|---|
| *H01L 27/00* | (2006.01) |
| *H01L 23/522* | (2006.01) |
| *H01L 27/11524* | (2017.01) |
| *H01L 27/1157* | (2017.01) |
| *H01L 23/528* | (2006.01) |
| *H01L 27/24* | (2006.01) |
| *H01L 27/11578* | (2017.01) |
| *H01L 27/11551* | (2017.01) |
| *H01L 21/822* | (2006.01) |
| *H01L 27/06* | (2006.01) |

(52) U.S. Cl.
CPC ...... *H01L 23/5221* (2013.01); *H01L 21/8221* (2013.01); *H01L 23/528* (2013.01); *H01L 27/0688* (2013.01); *H01L 27/1157* (2013.01); *H01L 27/11524* (2013.01); *H01L 27/11551* (2013.01); *H01L 27/11578* (2013.01); *H01L 27/2481* (2013.01); *H01L 2224/32145* (2013.01)

(58) Field of Classification Search
CPC ..... H01L 27/11578; H01L 2224/32145; H01L 27/0688; H01L 27/2481; H01L 27/11551; H01L 21/8221
See application file for complete search history.

(56) References Cited

U.S. PATENT DOCUMENTS

| | | | |
|---|---|---|---|
| 7,936,004 B2 | 5/2011 | Kito et al. | |
| 9,230,982 B1 * | 1/2016 | Yuan | G01R 31/025 |
| 9,236,131 B1 * | 1/2016 | Yuan | G11C 16/10 |

(Continued)

*Primary Examiner* — Ngan Ngo
(74) *Attorney, Agent, or Firm* — Oblon, McClelland, Maier & Neustadt, L.L.P.

(57) ABSTRACT

A semiconductor memory device according to an embodiment comprises: when three directions intersecting each other are assumed to be first through third directions, and two directions intersecting each other in a plane extending in the first and second directions are assumed to be fourth and fifth directions, a memory cell array including: a conductive layer stacked in the third direction above a semiconductor substrate and having a first region; and a first columnar body penetrating the first region of the conductive layer in the third direction and including a semiconductor film, the first columnar body having a cross-section along the first and second directions in which, at a first position which is a certain position in the third direction, a length in the fourth direction is shorter than a length in the fifth direction.

15 Claims, 27 Drawing Sheets

(56) References Cited

U.S. PATENT DOCUMENTS

| | | | |
|---|---|---|---|
| 2007/0252201 A1 | 11/2007 | Kito et al. | |
| 2009/0323385 A1* | 12/2009 | Scheuerlein | H01L 27/101 365/51 |
| 2010/0289084 A1* | 11/2010 | Yoon | H01L 27/228 257/368 |
| 2011/0001217 A1* | 1/2011 | Neuilly | H01L 23/49827 257/532 |
| 2011/0147824 A1* | 6/2011 | Son | G11C 16/0483 257/324 |
| 2011/0151667 A1* | 6/2011 | Hwang | H01L 27/11551 438/667 |
| 2011/0303958 A1* | 12/2011 | Matsuo | H01L 29/7926 257/314 |
| 2011/0316064 A1* | 12/2011 | Kim | H01L 27/11582 257/314 |
| 2012/0001247 A1* | 1/2012 | Alsmeier | H01L 27/11551 257/316 |
| 2012/0001249 A1* | 1/2012 | Alsmeier | H01L 27/11551 257/319 |
| 2012/0003828 A1* | 1/2012 | Chang | H01L 27/1157 438/591 |
| 2012/0094453 A1* | 4/2012 | Han | H01L 27/11582 438/269 |
| 2012/0199895 A1* | 8/2012 | Nitta | G11C 11/14 257/295 |
| 2013/0161726 A1* | 6/2013 | Kim | H01L 29/792 257/324 |
| 2014/0160830 A1* | 6/2014 | Chung | G11C 13/0004 365/96 |
| 2014/0167131 A1* | 6/2014 | Lu | H01L 29/7889 257/316 |
| 2014/0192584 A1* | 7/2014 | Aritome | G11C 5/063 365/72 |
| 2014/0252363 A1* | 9/2014 | Liu | H01L 27/11556 257/66 |
| 2015/0069484 A1* | 3/2015 | Lee | H01L 29/66833 257/314 |
| 2015/0263035 A1* | 9/2015 | Tsuji | H01L 27/11565 438/268 |
| 2016/0071870 A1* | 3/2016 | Minami | H01L 27/11582 257/314 |
| 2016/0071881 A1* | 3/2016 | Lee | H01L 27/11582 257/314 |

* cited by examiner

SEMICONDUCTOR MEMORY DEVICE WITH CONDUCTIVE COLUMNAR BODY

CROSS-REFERENCE TO RELATED APPLICATIONS

This application is based upon and claims the benefit of priority from the prior U.S. Provisional Application 62/134,625, filed on Mar. 18, 2015, the entire contents of which are incorporated herein by reference.

BACKGROUND

Field

An embodiment of the present invention relates to a semiconductor memory device.

Description of the Related Art

One kind of semiconductor memory device is a flash memory. Generally, a NAND type flash memory in particular is widely used since it is low cost and has a large capacity. Moreover, up to now, many technologies for further increasing the capacity of this NAND type flash memory have been proposed. One such technology is a structure in which memory cells are three-dimensionally disposed.

DETAILED DESCRIPTION

A semiconductor memory device according to an embodiment comprises: when three directions intersecting each other are assumed to be first through third directions, and two directions intersecting each other in a plane extending in the first and second directions are assumed to be fourth and fifth directions, a memory cell array including: a conductive layer stacked in the third direction on a semiconductor substrate and having a first region; and a first columnar body penetrating the first region of the conductive layer in the third direction and including a semiconductor film, the first columnar body having a cross-section along the first and second directions in which, at a first position which is a certain position in the third direction, a length in the fourth direction is shorter than a length in the fifth direction.

A semiconductor memory device according to an embodiment will be described below with reference to the drawings.

[Configuration and Structure of Semiconductor Memory Device According to Embodiment]

First, an overall configuration of a semiconductor memory device according to an embodiment will be described.

Figure 1:
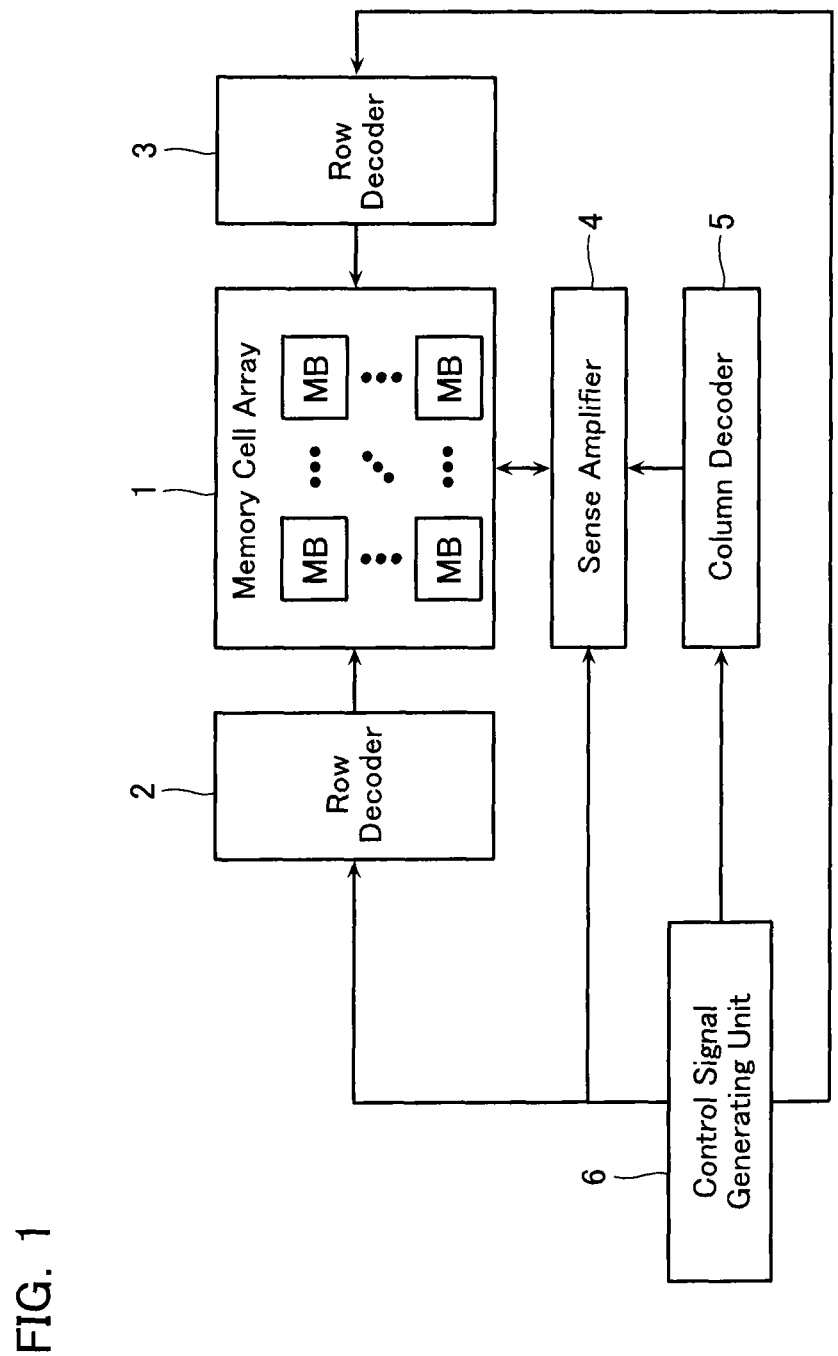
FIG. 1 is a view showing functional blocks of a semiconductor memory device according to an embodiment.

FIG. 1 is a view showing functional blocks of the semiconductor memory device according to the embodiment.

The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory transistors MT, being a plurality of memory cells MC, arranged three-dimensionally therein, and is a unit of an erase operation of data. Note that each of the memory blocks MB is divided by a plurality of trenches extending in one direction. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a high voltage employed during the write operation or the erase operation, generates a control signal and controls the row decoders 2 and 3, the sense amplifier 4, and the column decoder 5.

Next, an outline of a structure of the memory cell array 1 will be described.

Figure 2:
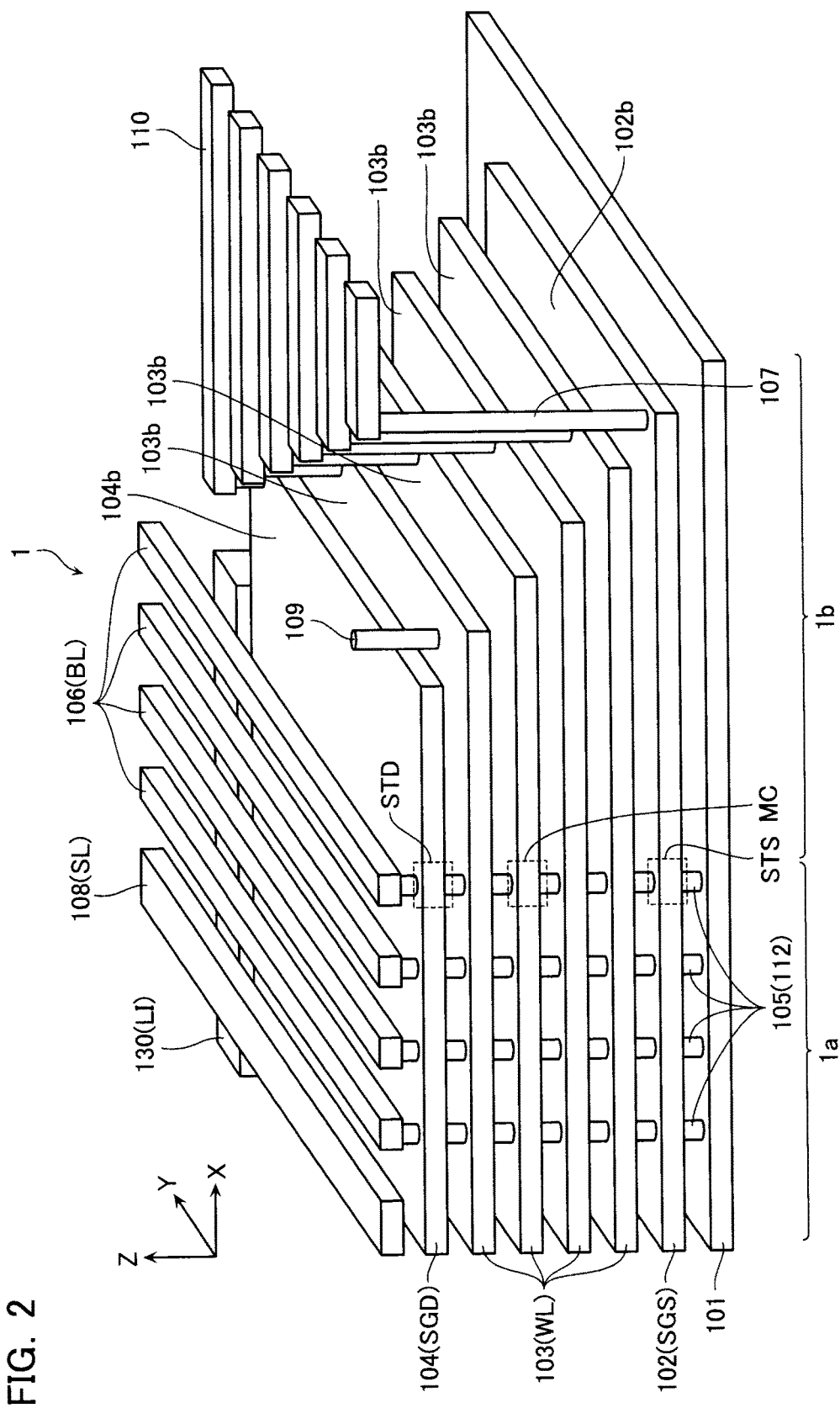
FIG. 2 is a perspective view showing a structure of a memory cell array in the semiconductor memory device according to the embodiment.

FIG. 2 is a perspective view showing the structure of the memory cell array in the semiconductor memory device according to the embodiment. Note that FIG. 2 is one example of the structure of the memory cell array 1, and numbers, and so on, of each of the configurations are not limited to those of this example.

As shown in FIG. 2, the memory cell array 1 includes: a semiconductor substrate 101; and a plurality of conductive layers 102 to 104 stacked in a Z direction (stacking direction) on the semiconductor substrate 101. The conductive layers 102 to 104 are formed from the likes of tungsten (W) or polysilicon (Poly-Si), for example. The conductive layer 102 functions as a source side select gate line SGS. The conductive layer 103 functions as a word line WL. The conductive layer 104 functions as a drain side select gate line SGD. Hereafter, the source side select gate line SGS and the drain side select gate line SGD will sometimes also be referred to simply as "select gate line".

Moreover, the memory cell array 1 includes a plurality of memory columnar bodies 105 extending in the Z direction. An intersection of the conductive layer 102 and the memory columnar body 105 functions as a source side select transistor STS. An intersection of the conductive layer 103 and the memory columnar body 105 functions as the memory cell MC. An intersection of the conductive layer 104 and the memory columnar body 105 functions as a drain side select transistor STD. Hereafter, the source side select transistor STS and the drain side select transistor STD will sometimes also be referred to simply as "select transistor".

The plurality of conductive layers 102 to 104 are formed in steps. That is, certain conductive layers 102 to 104 have contact portions 102b to 104b that do not face a lower surface of other conductive layers 102 to 104 positioned in a layer above. Moreover, the conductive layers 102 to 104 are connected to a via 107 at these contact portions 102b to 104b. A wiring line 110 is disposed on an upper end of the via 107. Note that the via 107 and the wiring line 110 are formed from the likes of tungsten (W), for example.

In addition, the memory cell array 1 includes a conductive layer 130 that faces side surfaces in a Y direction of the plurality of conductive layers 102 to 104 and extends in an X direction. A lower surface of the conductive layer 130 contacts the semiconductor substrate 101. The conductive layer 130 is formed from the likes of tungsten (W), for example, and functions as a source contact LI.

Moreover, the memory cell array 1 includes a plurality of conductive lines 106 and a conductive line 108 that are positioned above the plurality of conductive layers 102 to 104 and the memory columnar body 105, are aligned in plurality in the X direction, and extend in the Y direction. The memory columnar bodies 105 are respectively electrically connected to lower surfaces of the conductive lines 106. Note that the conductive line 106 is formed from the likes of tungsten (W), for example, and functions as a bit line BL. The conductive layer 130 is electrically connected to a lower surface of the conductive line 108. Note that the conductive line 108 is formed from, for example, tungsten (W), and functions as a source line SL.

Furthermore, the memory cell array 1 includes a beam columnar body 109. The beam columnar body 109 supports a posture of an inter-layer insulating layer not illustrated disposed between the conductive layers 102 to 104, in a manufacturing step.

Note that hereafter, a region where the plurality of memory columnar bodies 105 are disposed, of the memory cell array 1 will sometimes also be referred to as "memory region 1a", and a region where the contact portions 102b to 104b of the plurality of conductive layers 102 to 104 are formed, of the memory cell array 1 will sometimes also be referred to as "contact region 1b".

Next, a structure of the memory columnar body 105 and a periphery thereof will be described.

Figure 3:
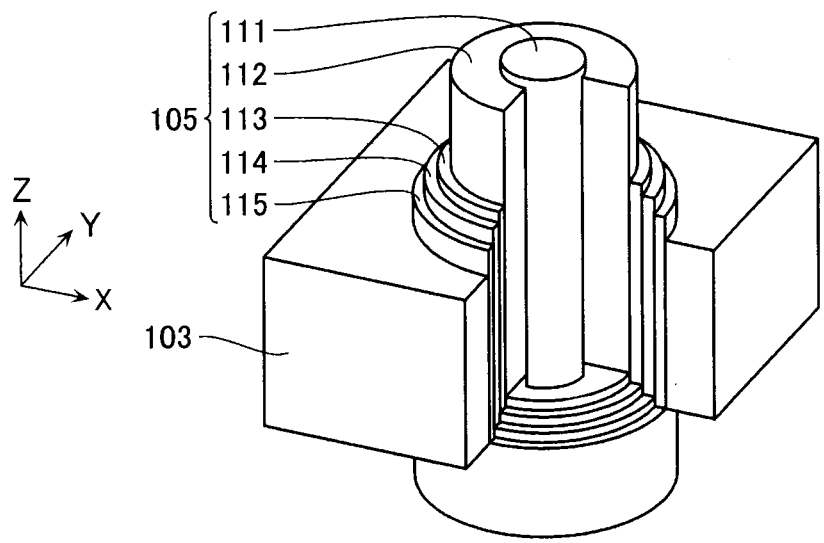
FIG. 3 is a perspective view showing a structure of a memory columnar body and a periphery thereof, of the memory cell array in the semiconductor memory device according to the embodiment.

FIG. 3 is a perspective view showing the structure of the memory columnar body and the periphery thereof, of the memory cell array in the semiconductor memory device according to the embodiment.

The memory columnar body 105 includes the following stacked from the center to the outside thereof, namely: an oxide film core 111; a semiconductor film 112; a tunnel insulating film 113; a charge accumulation film 114; and a block insulating film 115. The oxide film core 111 is formed from, for example, a silicon oxide film ($SiO_2$). The semiconductor film 112 is formed from, for example, silicon (Si), silicon-germanium (Si—Ge), silicon carbide (SiC), germanium (Ge), and carbon (C). The tunnel insulating film 113 and the block insulating film 115, in addition to being formed from a silicon oxide film ($SiO_2$), are formed from, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO. The charge accumulation film 114 is formed from, for example, a silicon nitride film (SiN). Note that the tunnel insulating film 113 and the charge accumulation film 114 may be formed in an entire longer direction of the memory columnar body 105, or may be formed only at positions of side surfaces of the conductive layers 102 to 104.

As a result of the structure described above using FIGS. 2 and 3, the source side select transistor STS is configured at the intersection of the conductive layer 102 and the memory columnar body 105; the memory transistor MT is configured at the intersection of the conductive layer 103 and the memory columnar body 105; and the drain side select transistor STD is configured at the intersection of the conductive layer 104 and the memory columnar body 105. Hereafter, a group of the plurality of memory transistors MT sharing one memory columnar body 105 will be referred to as "memory string MS", and a group of the memory string MS and the select transistors STS and STD sharing one memory columnar body 105 will be referred to as "memory unit MU".

Next, an equivalent circuit of the memory unit MU will be mentioned.

Figure 4:
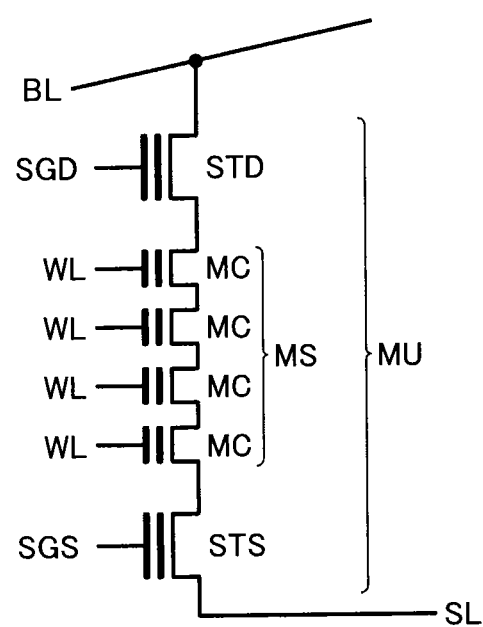
FIG. 4 is an equivalent circuit diagram of a memory unit of the memory cell array in the semiconductor memory device according to the embodiment.

FIG. 4 is an equivalent circuit diagram of the memory unit of the memory cell array in the semiconductor memory device according to the embodiment.

Each of the memory units MU of the memory cell array 1 includes: the memory string MS including a plurality of the memory transistors MT; a plurality of the source side select transistors STS connected between the source line SL and a lower end of the memory string MS; and a plurality of the drain side select transistors STD connected between the bit line BL and an upper end of the memory string MS. These source side select transistor STS, memory transistor MT, and drain side select transistor STD are connected in series from the source line SL to the bit line BL.

Next, the structure of the memory cell array 1 will be described in detail.

Figure 5:
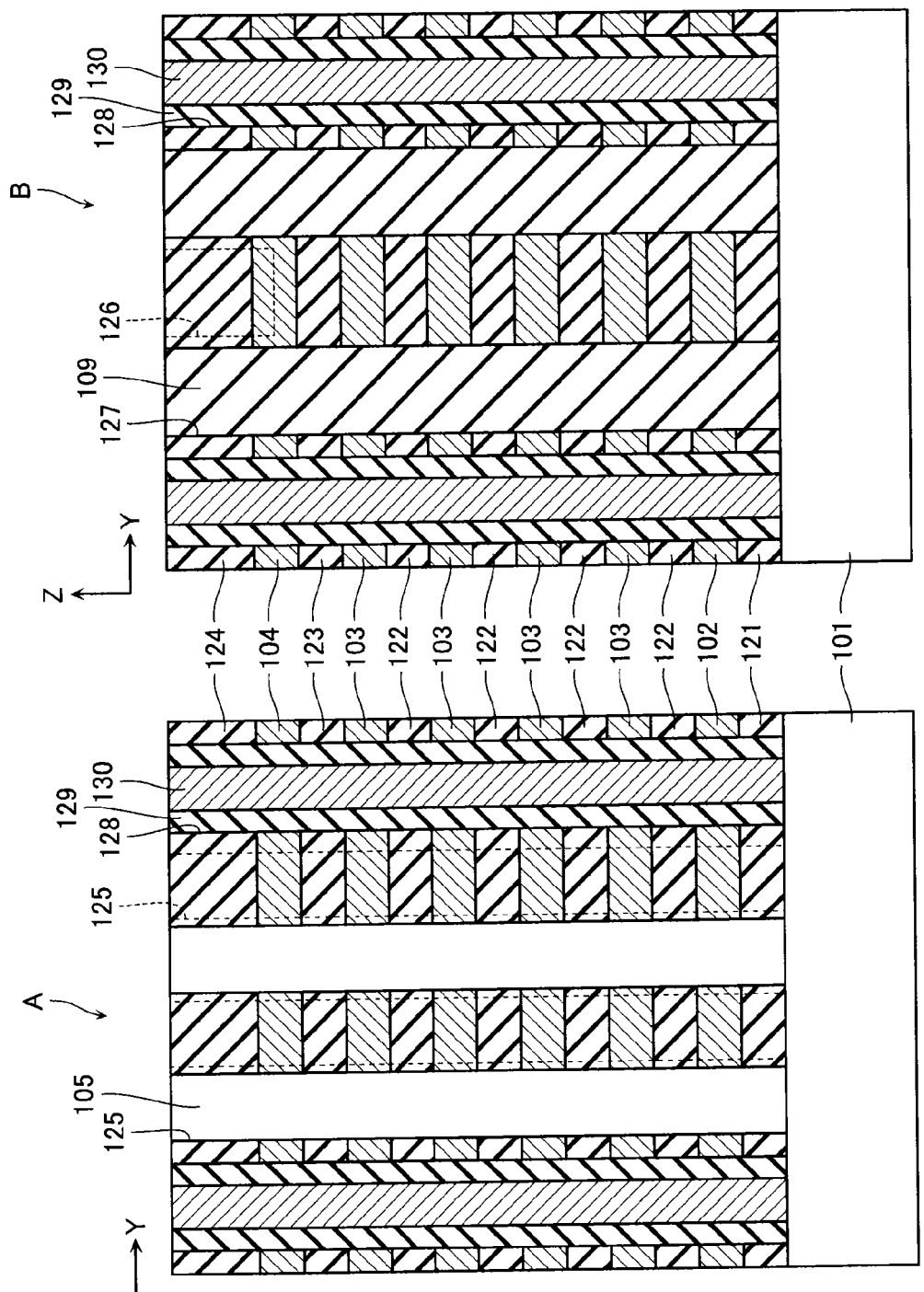
FIGS. 5 to 7 are cross-sectional views of the memory cell array in the semiconductor memory device according to the embodiment.
Figure 6:
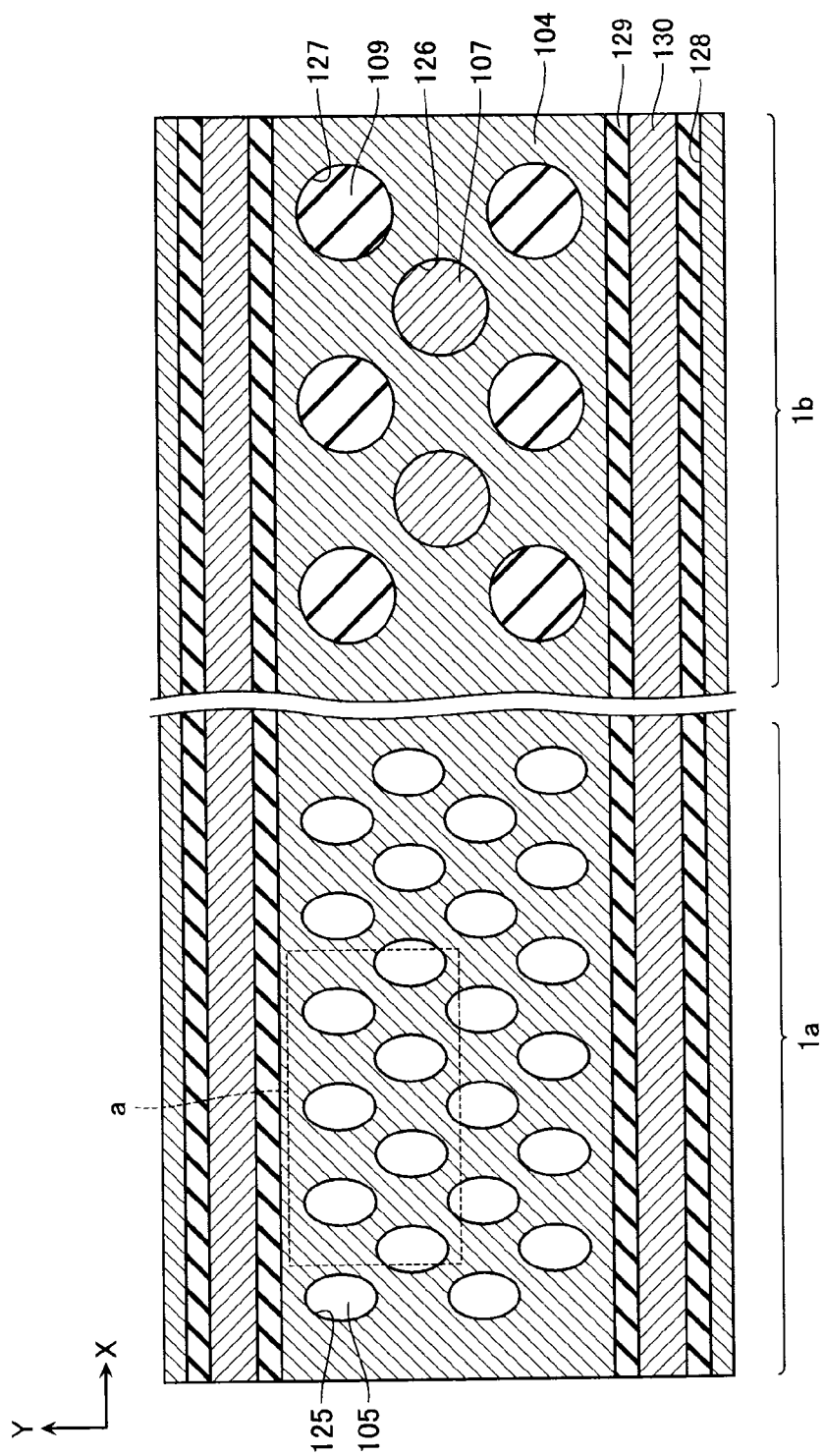

FIGS. 5 and 6 are cross-sectional views of the memory cell array in the semiconductor memory device according to the embodiment. A in FIG. 5 is a cross-sectional view in the Y-Z directions of the memory region 1a; and B in FIG. 5 is a cross-sectional view in the Y-Z directions of the contact region 1b. Moreover, FIG. 6 is a cross-sectional view in the X-Y directions at a position of the conductive layer 104 in the Z direction.

The memory cell array 1 includes: the conductive layer 102 stacked on the semiconductor substrate 101 via an inter-layer insulating layer 121; a plurality of the conductive layers 103 stacked on the conductive layer 102 via an inter-layer insulating layer 122; the conductive layer 104 stacked on the conductive layer 103 via an inter-layer insulating layer 123; and an inter-layer insulating layer 124 stacked on the conductive layer 104. Moreover, the memory region 1a of the memory cell array 1 has formed therein a plurality of memory holes 125 penetrating in the Z direction from the inter-layer insulating layer 121 to the inter-layer insulating layer 124, and these memory holes 125 are buried with a plurality of the memory columnar bodies 105. Note that the memory columnar body 105 has the multi-layer film structure shown in FIG. 3. On the other hand, the contact region 1b of the memory cell array 1 has formed therein a plurality of via holes 126 extending in the Z direction from an upper surface of the inter-layer insulating layer 124 to each of the conductive layers 102 to 104, and these via holes 126 are buried with a plurality of the vias 107. Moreover, the contact region 1b of the memory cell array 1 has formed therein a plurality of beam holes 127 penetrating in the Z direction from the inter-layer insulating layer 121 to the inter-layer insulating layer 124, and these beam holes 127 are buried with a plurality of the beam columnar bodies 109. These beam columnar bodies 109 are employed for maintaining a structure of the contact portions 102b to 104b of the conductive layers 102 to 104. Furthermore, the memory cell array 1 has disposed therein a plurality of trenches 128 that sandwich a region of arrangement of the memory columnar body 105, the via 107, and the beam columnar body 109, have the Z direction as a depth direction, and have the X direction as an extension direction. This trench 128 includes a conductive layer 130 disposed via an insulating layer 129. This conductive layer 130 is electrically connected to the source line SL (not illustrated) disposed on the inter-layer insulating layer 124.

Now, the structure and arrangement of the memory columnar body 105 will be described in detail.

Figure 7:
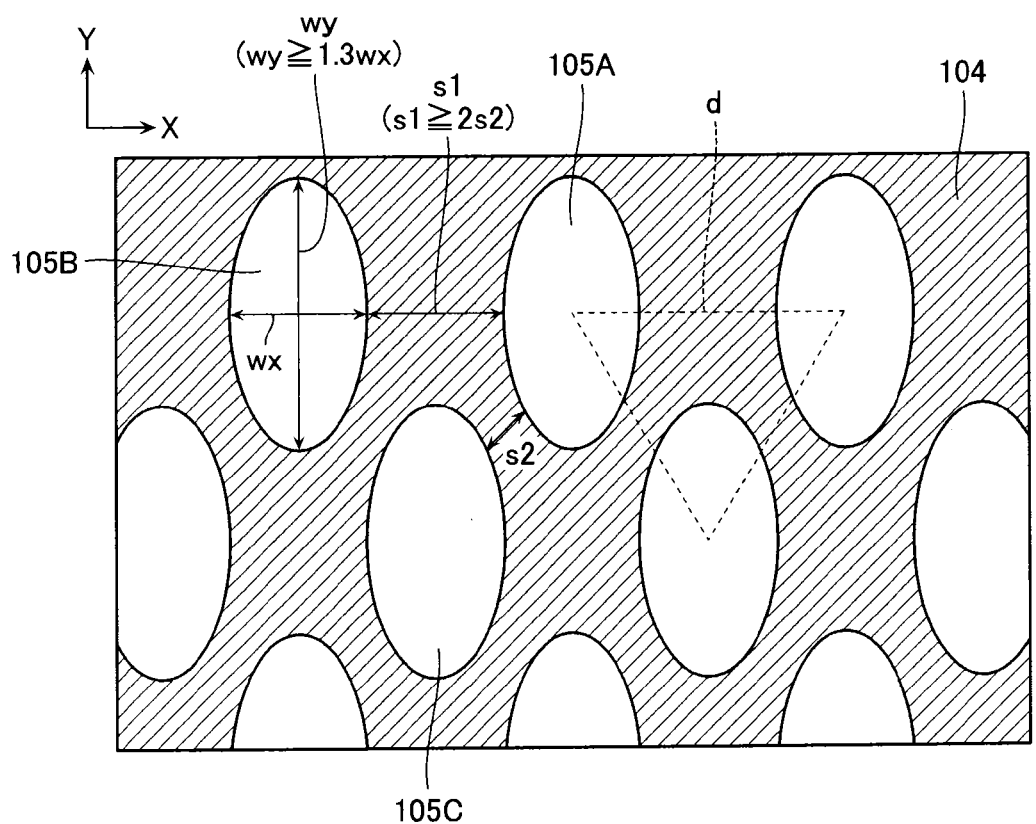

FIG. 7 is a cross-sectional view of the memory cell array in the semiconductor memory device according to the embodiment. FIG. 7 is a cross-sectional view in the X-Y directions enlarging the region surrounded by the dashed line a in FIG. 6.

As shown in FIG. 7, each of the memory columnar bodies 105 of the embodiment has a cross-section in the X-Y directions of an oval shape having the X direction as a short axis direction and the Y direction as a long axis direction. In other words, each of the memory columnar bodies 105 has a cross-section in which a length wx in the X direction is shorter than a length wy in the Y direction. For example, in the case of FIG. 7, the length wy in the Y direction of the memory columnar body 105 is configured to be 1.3 or more times the length wx in the X direction of the memory columnar body 105. Moreover, as shown in FIG. 7, the plurality of memory columnar bodies 105 are arranged staggered in the X direction and the Y direction. For example, in the case of FIG. 7, the memory columnar bodies 105 are arranged such that centers of three memory columnar bodies 105 adjacent to each other roughly configure an equilateral triangle as shown by the dashed line d in FIG. 7. In the case that a certain memory columnar body is assumed to be 105A, a memory columnar body adjacent in the X direction to this memory columnar body 105A is assumed to be 105B, and a memory columnar body disposed in between the memory columnar bodies 105A and 105B in the X direction and disposed at a different position to the memory columnar bodies 105A and 105B in the Y direction is assumed to be 105C, the plurality of memory columnar bodies 105 are disposed such that a minimum spacing s1 of the memory columnar bodies 105A and 105B is wider than a minimum spacing s2 of the memory columnar bodies 105A and 105C. For example, in the case of FIG. 7, the spacings s1 and s2 have a relationship of s1≥2×s2.

Next, a method of manufacturing the memory cell array 1 will be described.

FIGS. 8 to 23 are cross-sectional views explaining manufacturing steps of the memory cell array in the semiconductor memory device according to the embodiment. A in FIGS. 8, 10, 12, 14, 16, 18, 20, and 22 are cross-sectional views in the Y-Z directions of the memory region 1a; and B in FIGS. 8, 10, 12, 14, 16, 18, 20, and 22 are cross-sectional views in the Y-Z directions of the contact region 1b. Moreover, FIGS. 9, 11, 13, 15, 17, 19, 21, and 23 are cross-sectional views in the X-Y directions at a position of the uppermost layer conductive layer 104 in the Z direction.

Figure 8:
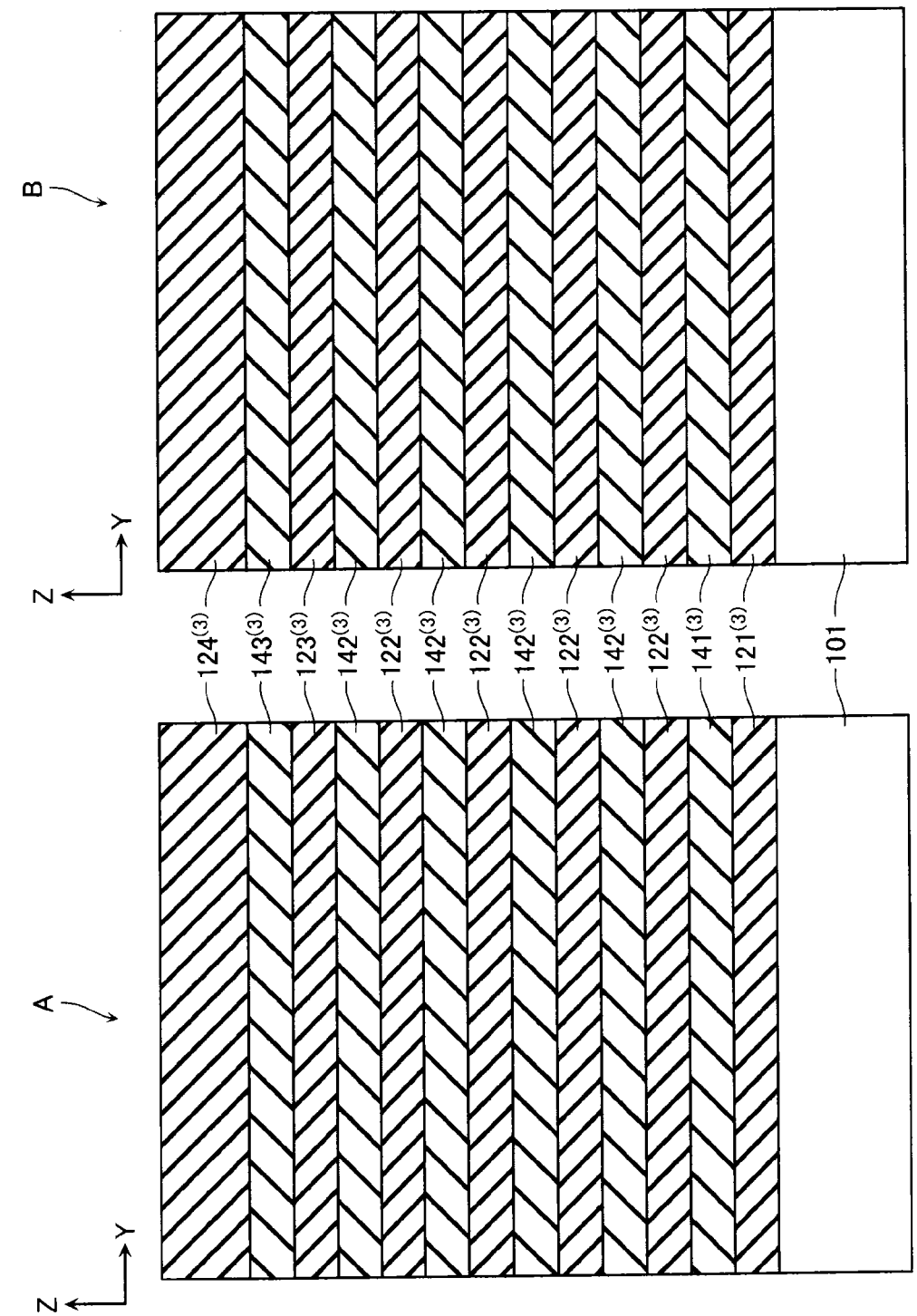
FIGS. 8 to 23 are cross-sectional views explaining manufacturing steps of the memory cell array in the semiconductor memory device according to the embodiment.
Figure 9:
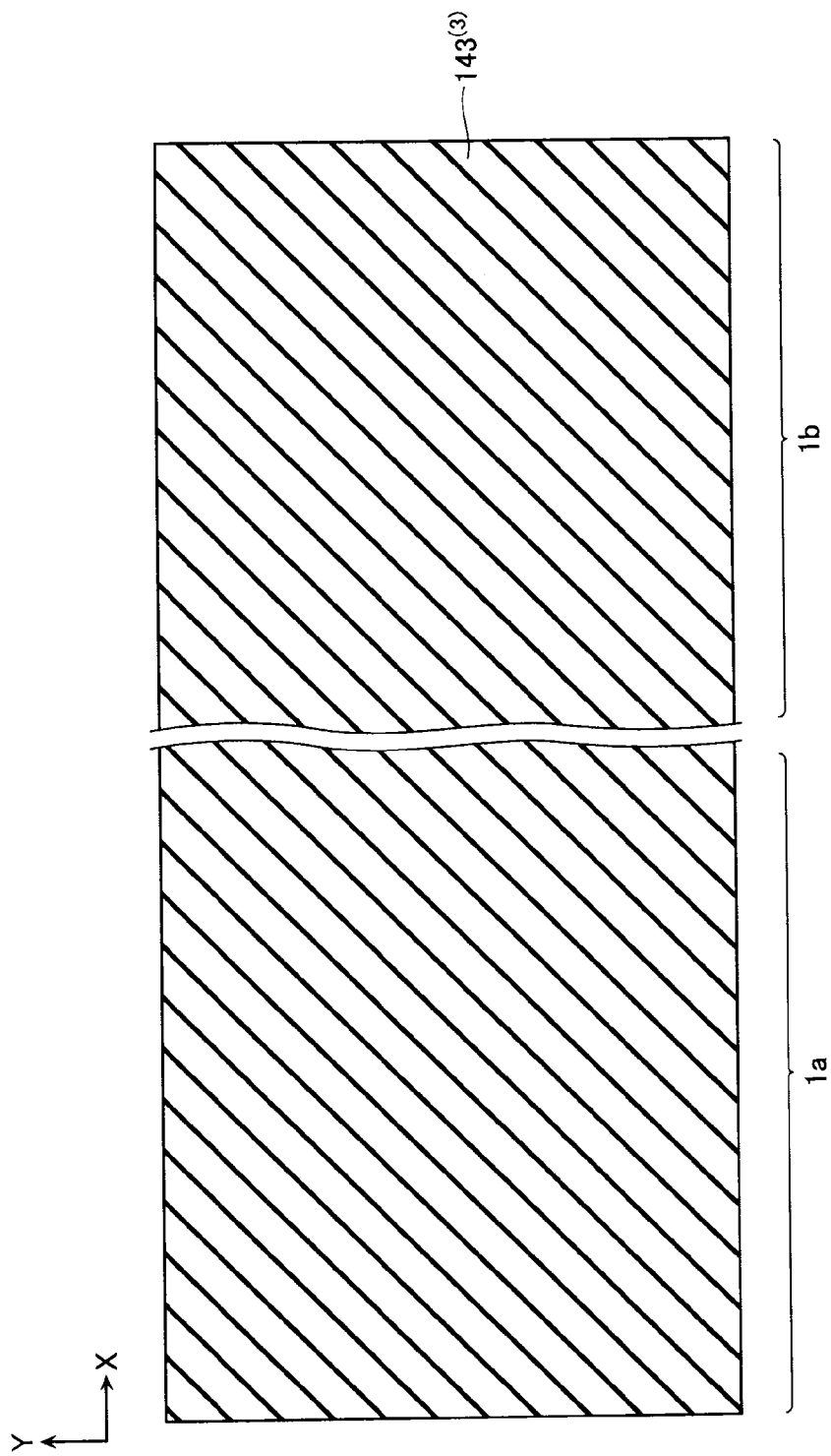

As shown in FIGS. 8 and 9, an inter-layer insulating layer $121^{(3)}$ and a sacrifice layer $141^{(3)}$ are stacked on the semiconductor substrate 101. Then, a plurality of inter-layer insulating layers $122^{(3)}$ and a plurality of sacrifice layers $142^{(3)}$ are stacked alternately on the sacrifice layer $141^{(3)}$. Then, an inter-layer insulating layer $123^{(3)}$, a sacrifice layer $143^{(3)}$, and an inter-layer insulating layer $124^{(3)}$ are stacked on the sacrifice layer $142^{(3)}$. Now, the inter-layer insulating layers $121^{(3)}$ to $124^{(3)}$ are formed from, for example, silicon oxide ($SiO_2$). Moreover, the sacrifice layers $141^{(3)}$ to $143^{(3)}$ are formed from, for example, silicon nitride (SiN).

Figure 10:
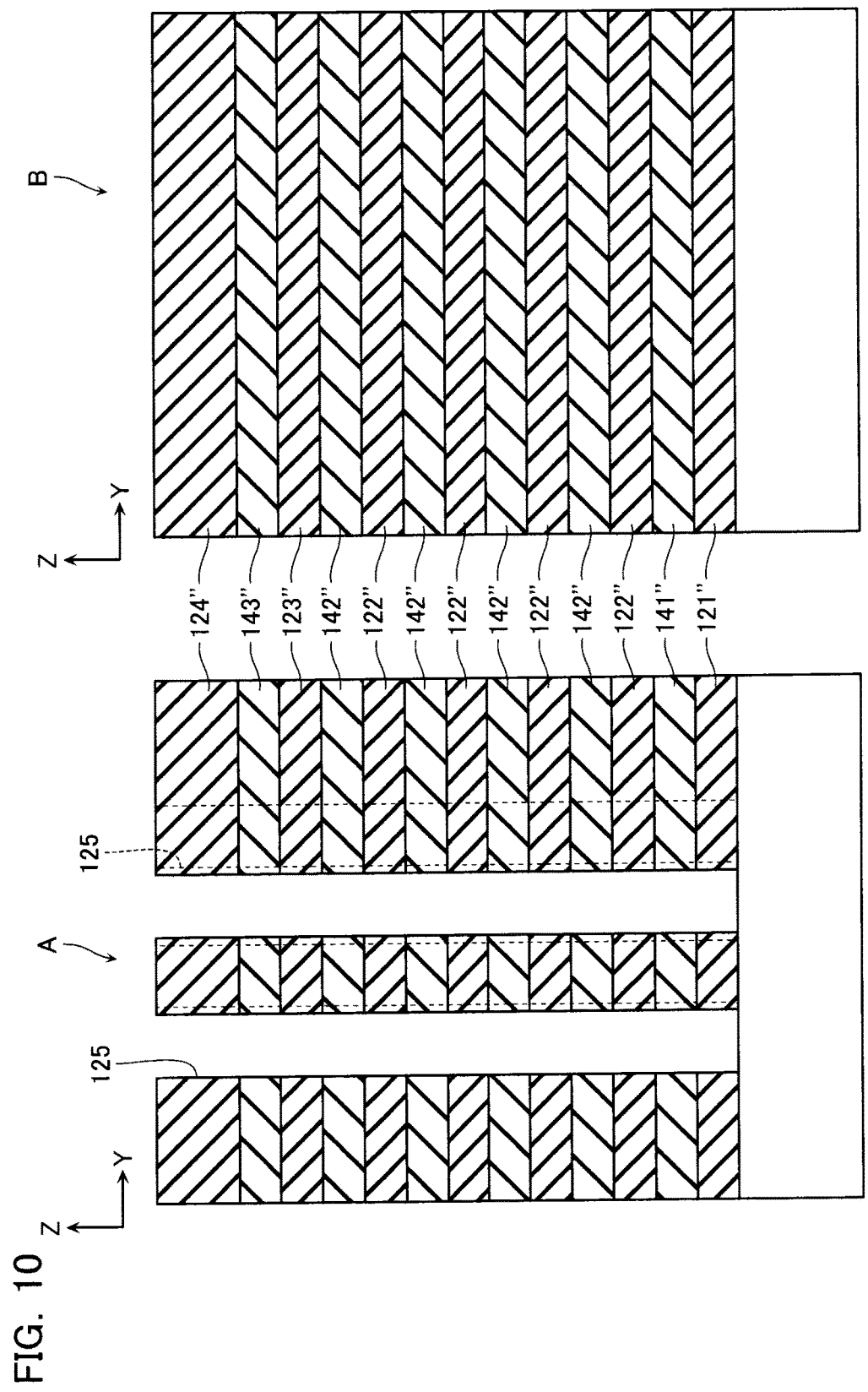
Figure 11:
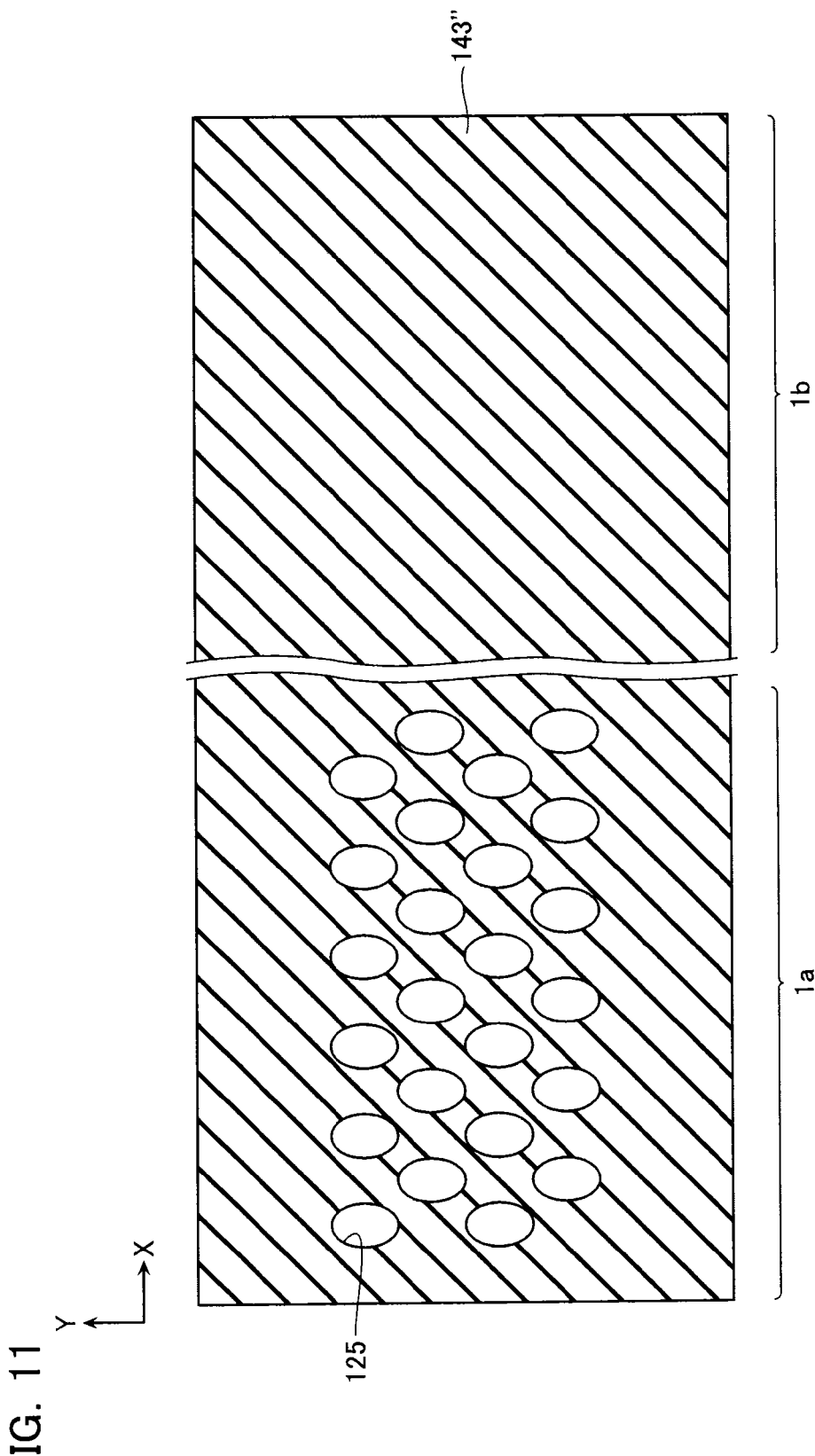

As shown in FIGS. 10 and 11, in the memory region 1a of the memory cell array 1, a plurality of through holes 125 extending in the Z direction are formed in the inter-layer insulating layers $121^{(3)}$ to $124^{(3)}$ and the sacrifice layers $141^{(3)}$ to $143^{(3)}$. As a result, the inter-layer insulating layers $121^{(3)}$ to $124^{(3)}$ and the sacrifice layers $141^{(3)}$ to $143^{(3)}$ become inter-layer insulating layers 121" to 124" and sacrifice layers 141" to 143". The through hole 125 becomes the memory hole 125. Now, the memory hole 125 is formed by lithography and dry etching after, for example, its cross-section in the X-Y directions has undergone exposure in an oval shape having the X direction as a short axis direction and having the Y direction as a long axis direction.

Figure 12:
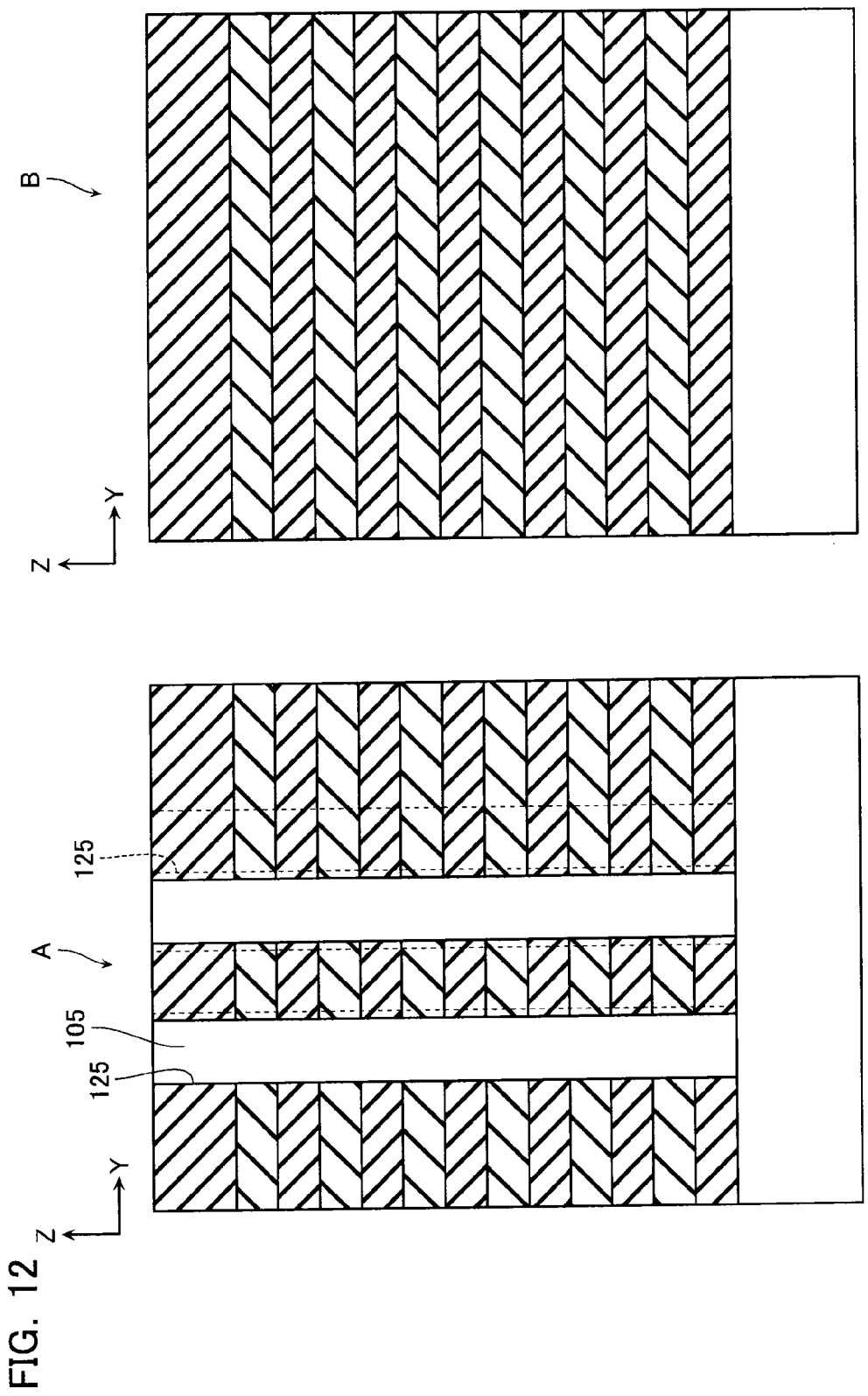
Figure 13:
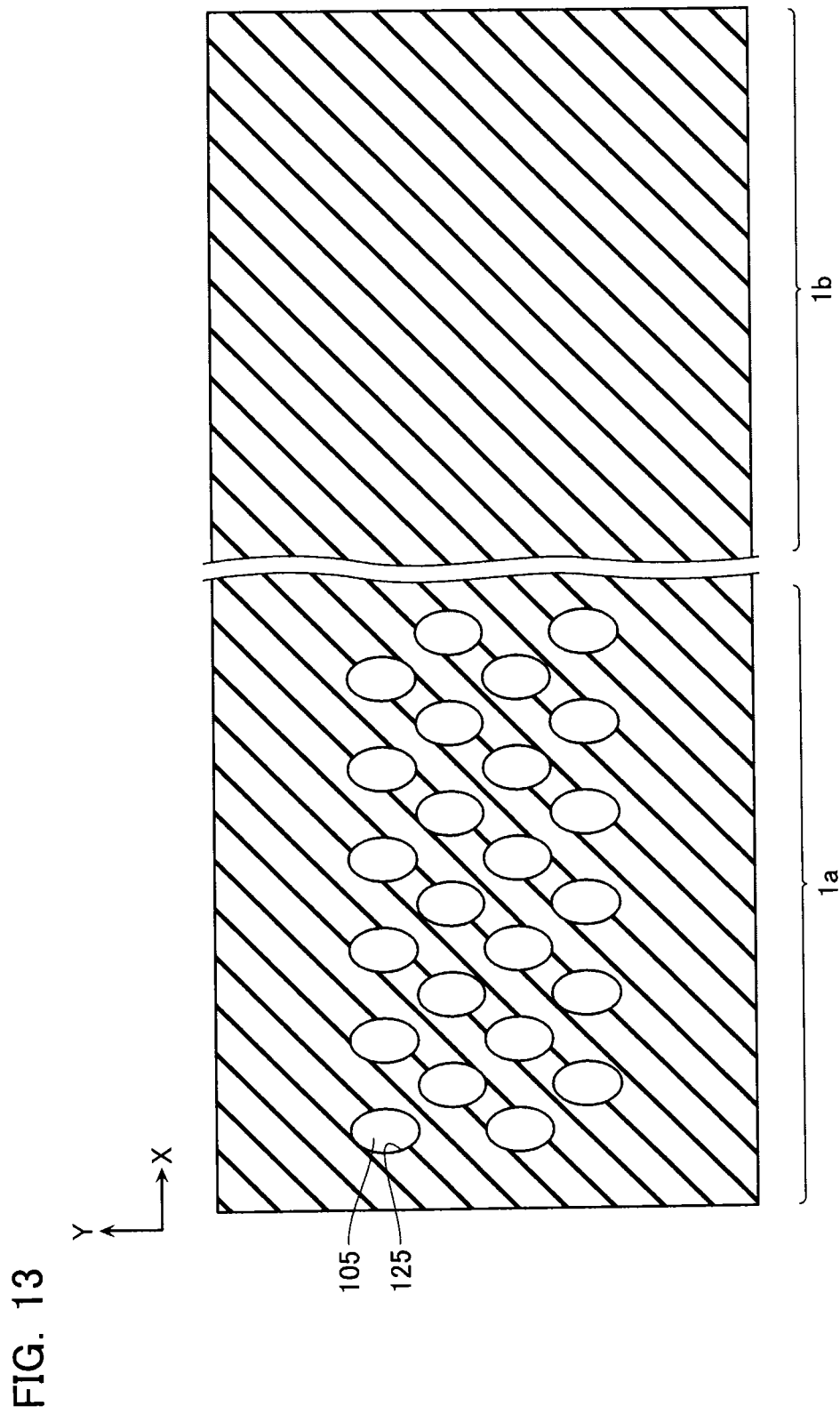

As shown in FIGS. 12 and 13, the memory hole 125 is buried with a material of the memory columnar body 105. The memory columnar body 105 has the following deposited sequentially therein, from its outside to its inside, namely: the block insulating film 115; the charge accumulation film 114; the tunnel insulating film 113; the semiconductor film 112; and the core insulating film 111. Now, the block insulating film 115, the tunnel insulating film 113, and the core insulating film 111 are formed from, for example, silicon oxide ($SiO_2$). The charge accumulation film 114 is formed from, for example, silicon nitride (SiN). The semiconductor film 112 is formed from, for example, polysilicon.

Figure 14:
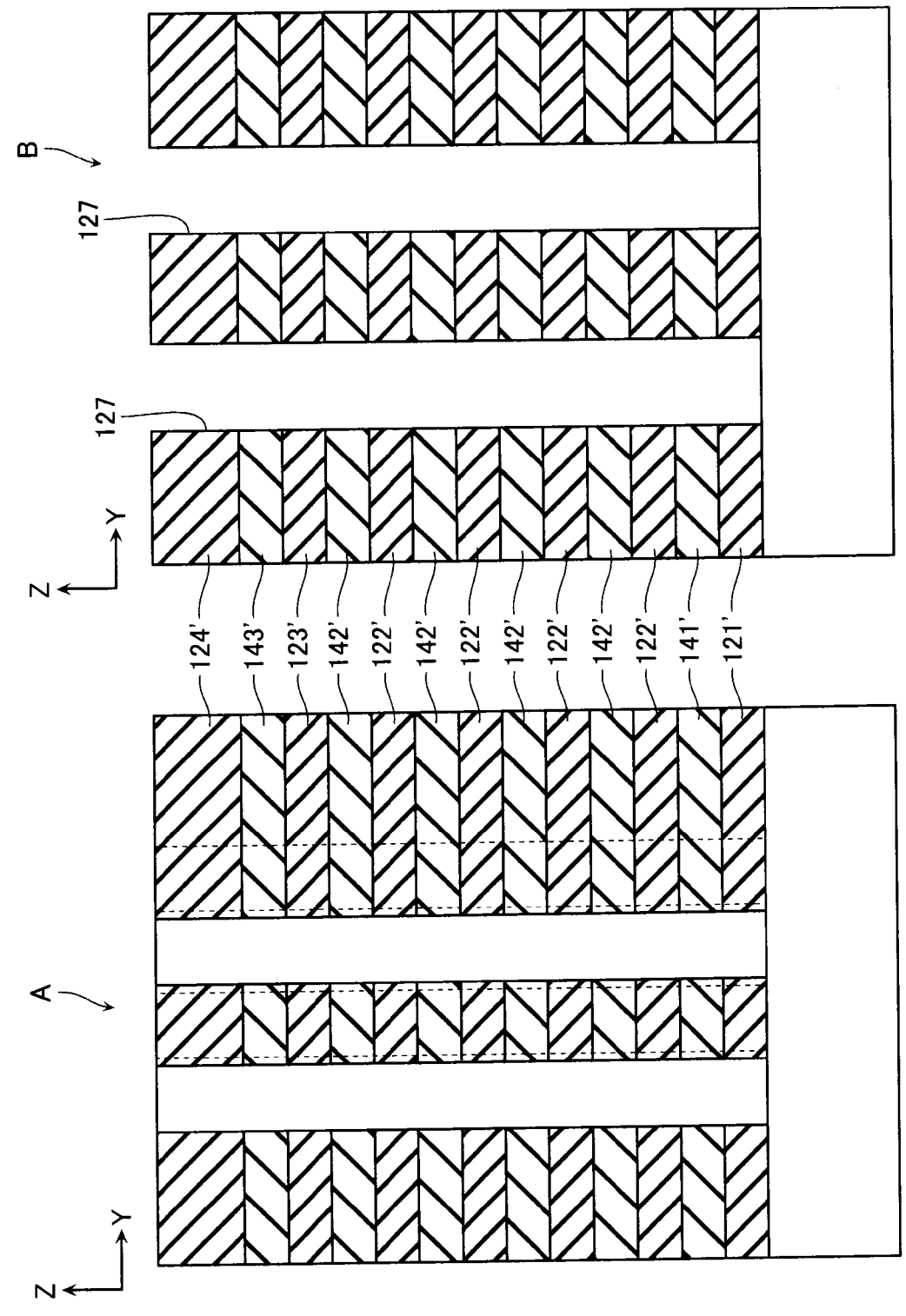
Figure 15:
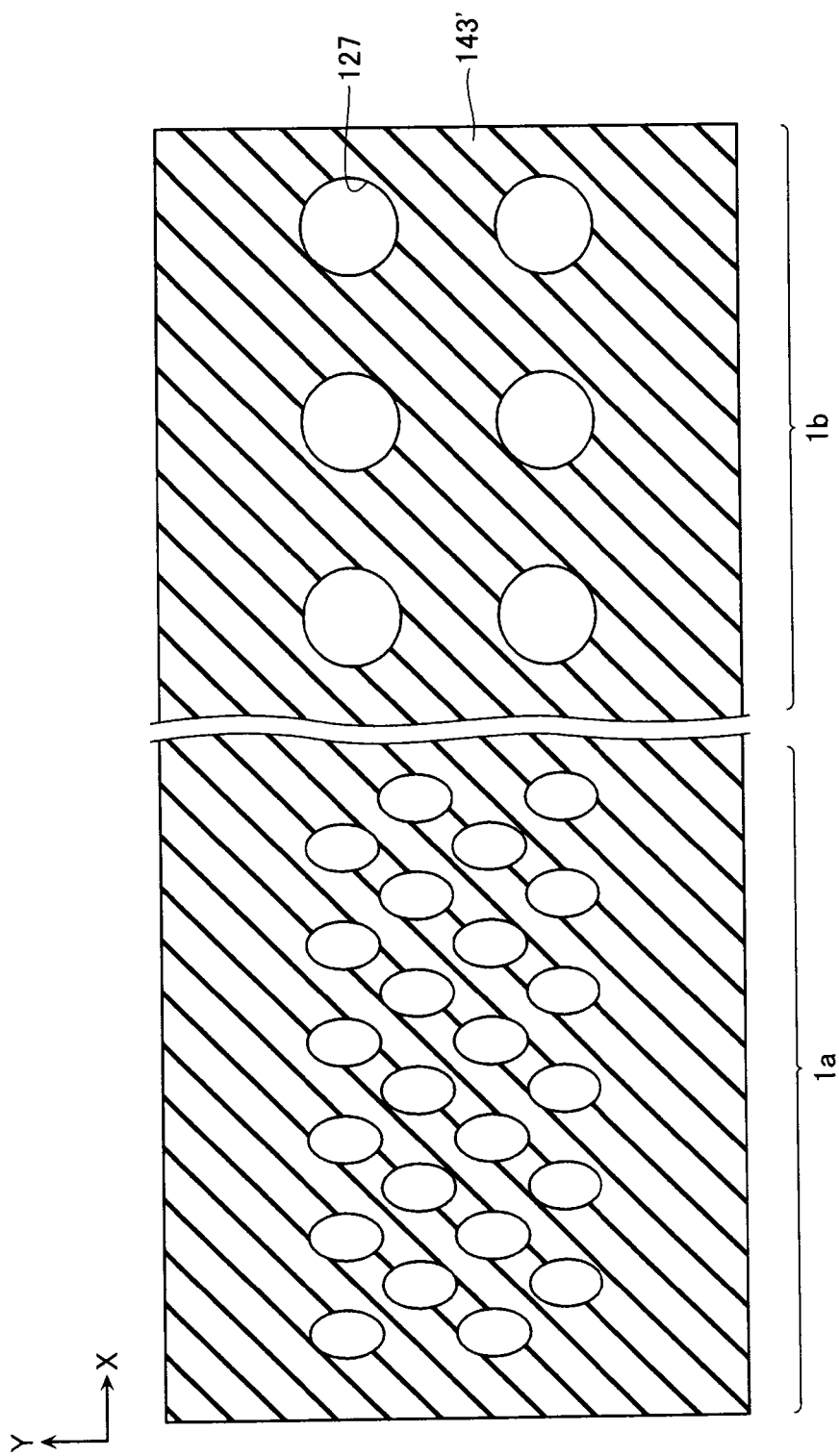

As shown in FIGS. 14 and 15, in the contact region 1b of the memory cell array 1, a plurality of through holes 127 extending in the Z direction are formed in the inter-layer insulating layers 121" to 124" and the sacrifice layers 141' to 143". As a result, the inter-layer insulating layers 121" to 124" and the sacrifice layers 141" to 143" become inter-layer insulating layers 121' to 124' and sacrifice layers 141' to 143'. The through hole 127 becomes the beam hole 127. The through hole 127 has its cross-section in the X-Y directions formed in roughly a circular shape.

Figure 16:
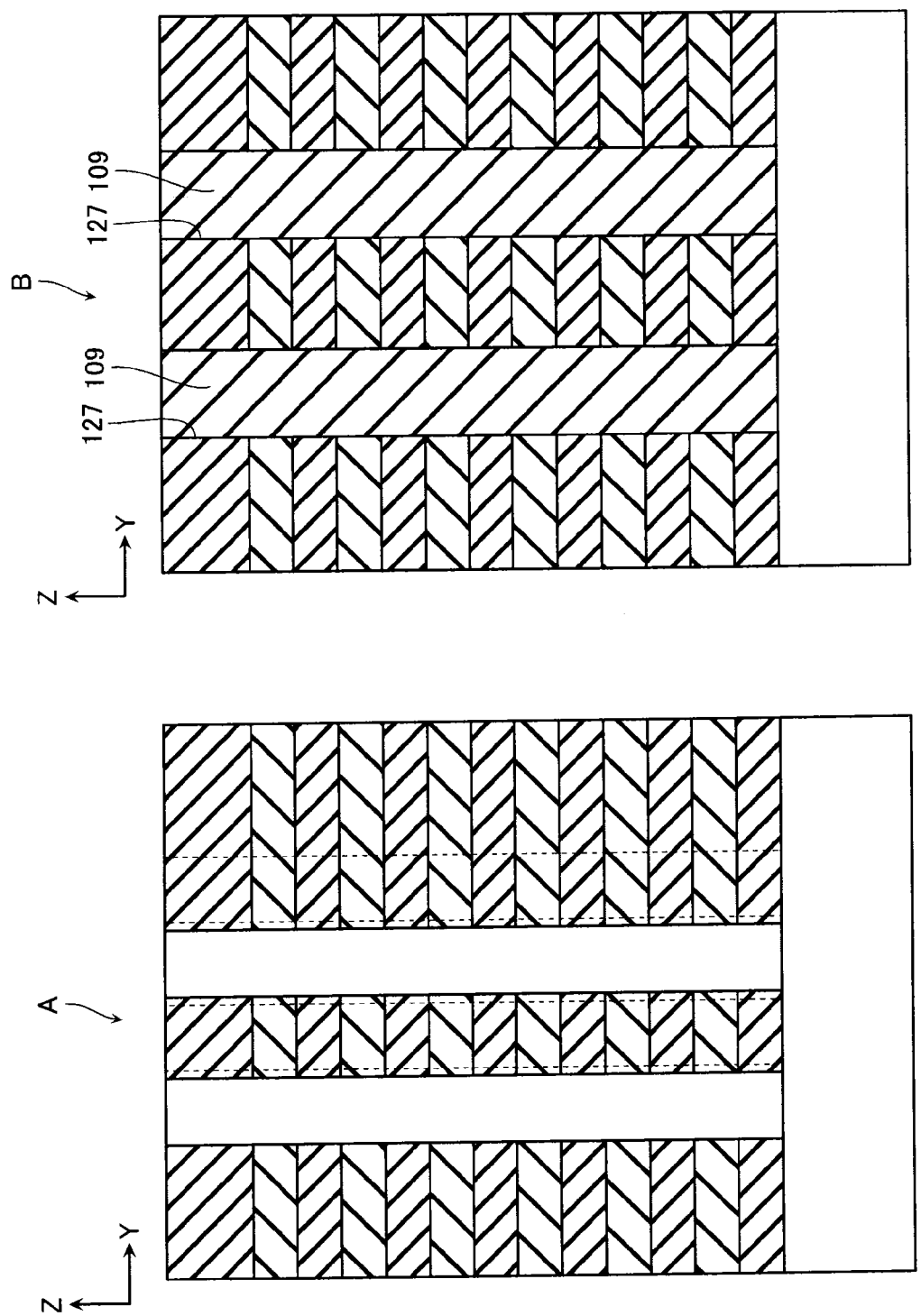
Figure 17:
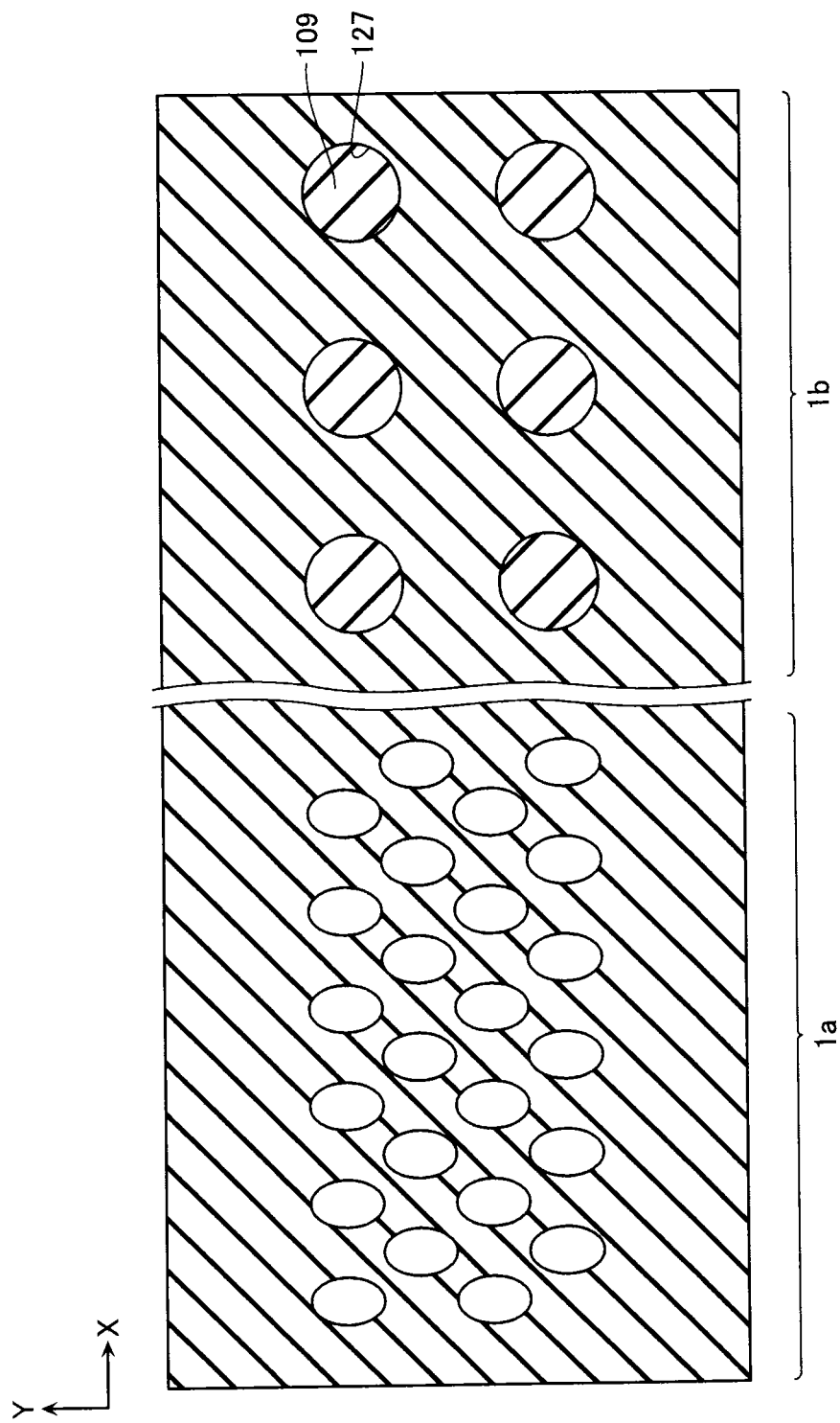

As shown in FIGS. 16 and 17, the through hole 127 is buried with a material of the beam columnar body 109. Now, the beam columnar body 109 is formed from, for example, silicon oxide ($SiO_2$).

Figure 18:
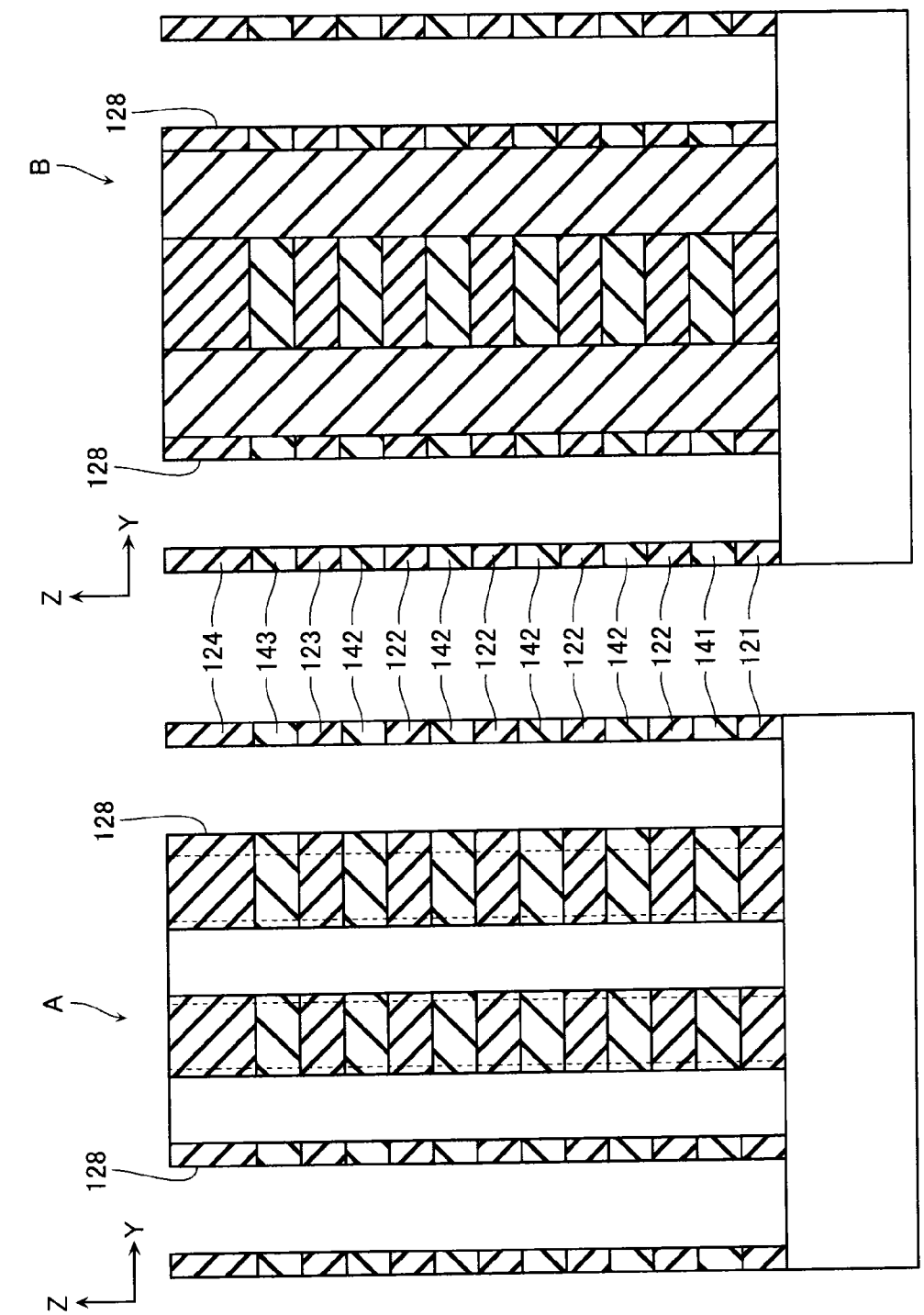
Figure 19:
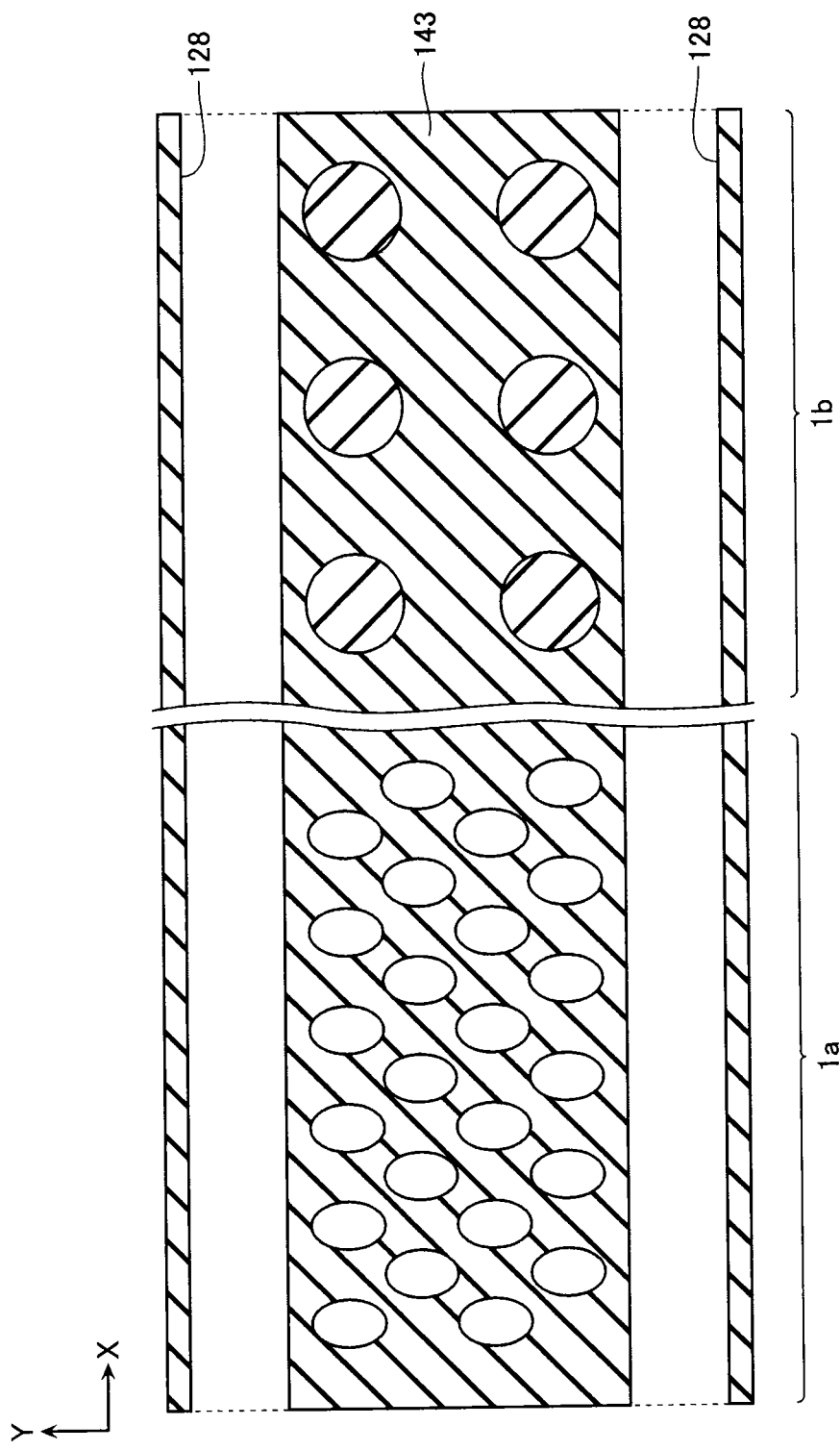

As shown in FIGS. 18 and 19, the plurality of trenches 128 having the Z direction as a depth direction and having the X direction as an extension direction are formed in the inter-layer insulating layers 121' to 124' and the sacrifice layers 141' to 143'. As a result, the inter-layer insulating layers 121' to 124' and the sacrifice layers 141' to 143' become the inter-layer insulating layers 121 to 124 and the sacrifice layers 141 to 143.

Figure 20:
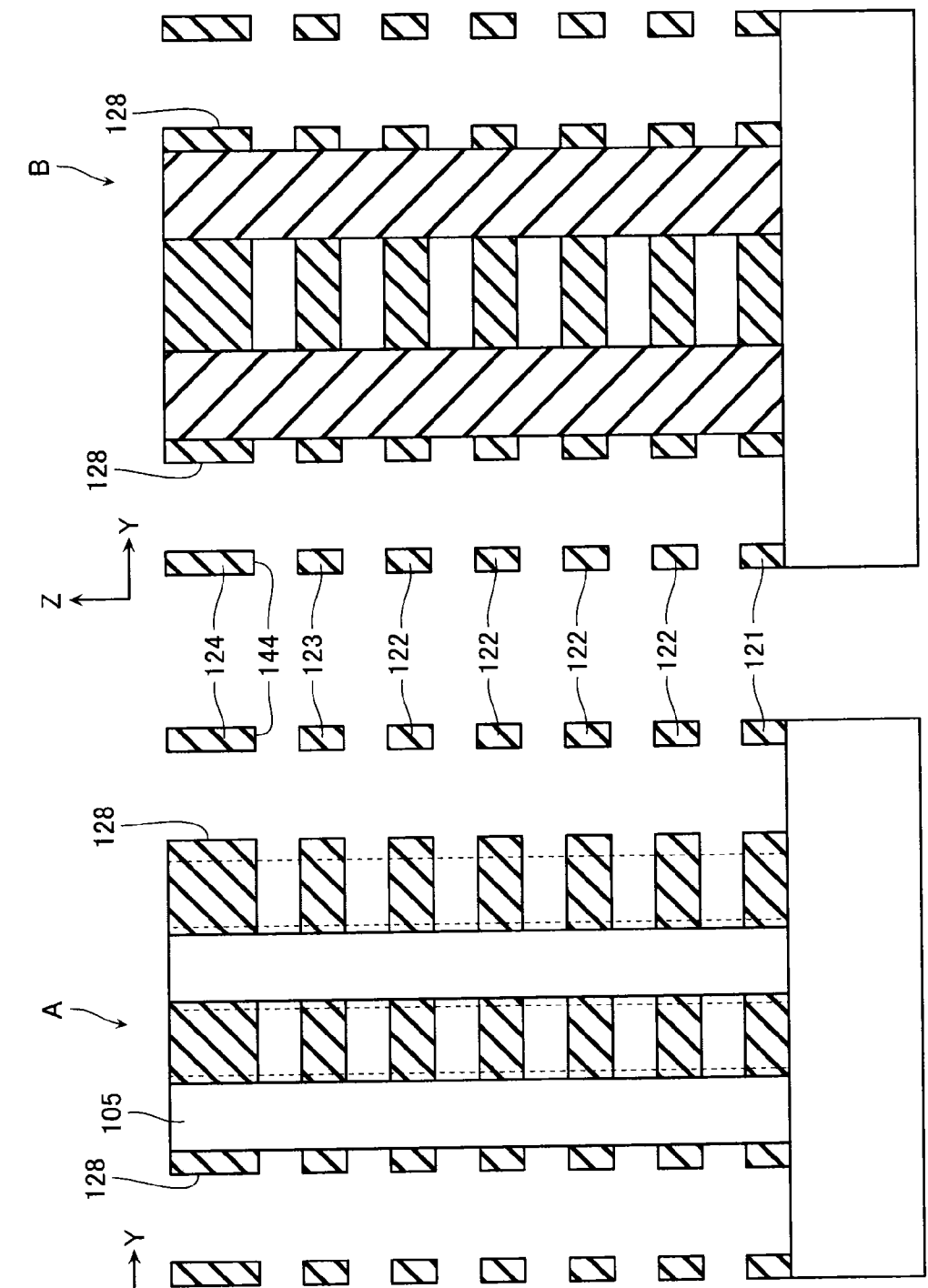
Figure 21:
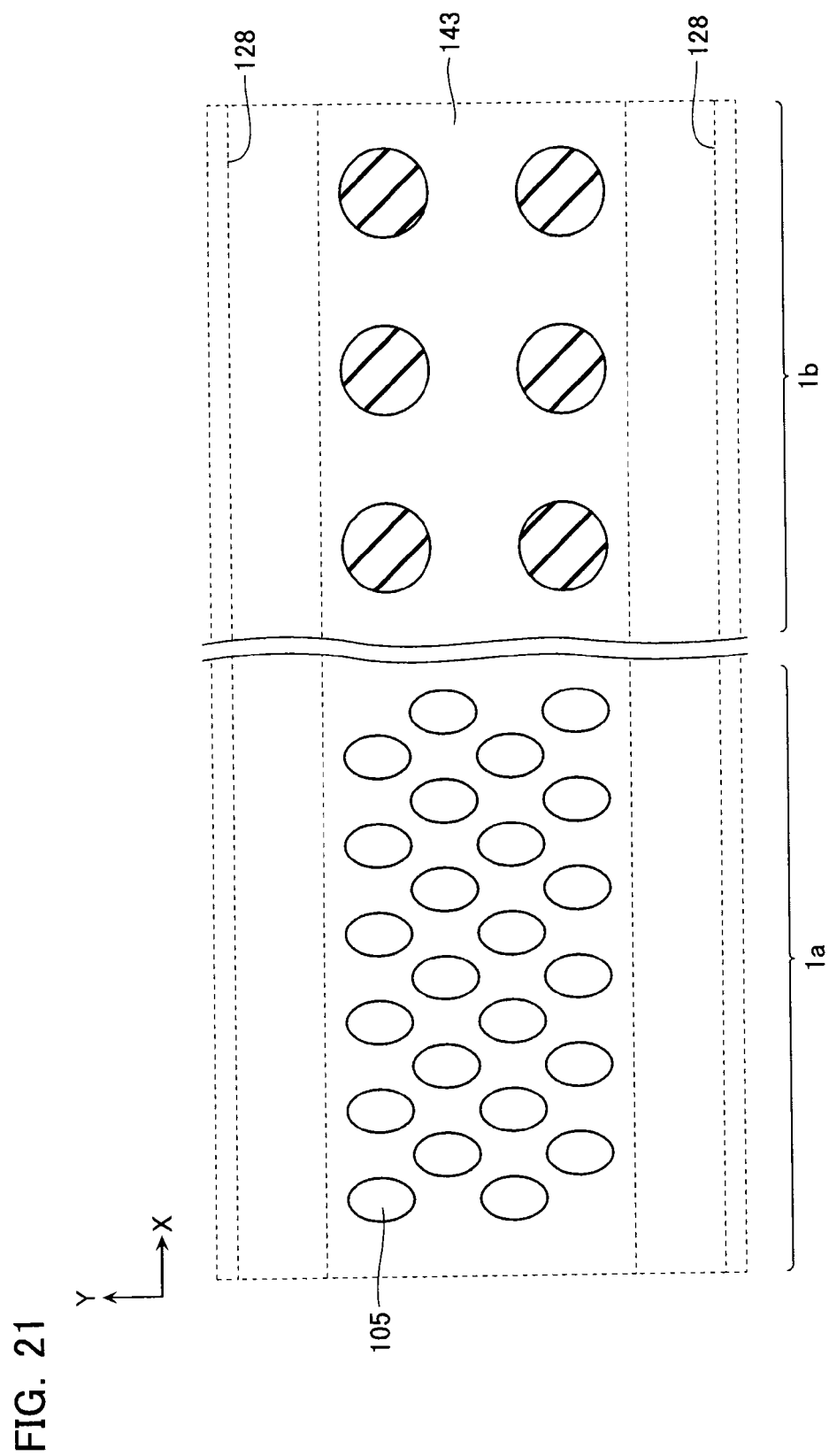

As shown in FIGS. 20 and 21, the sacrifice layers 141 to 143 are removed via the trench 128. Employed in removal of the sacrifice layers 141 to 143 is, for example, wet etching using a phosphoric acid solution. As a result, a gap 144 is formed between the inter-layer insulating layers 121 to 124. The memory columnar body 105 is exposed in the gap 144.

Figure 22:
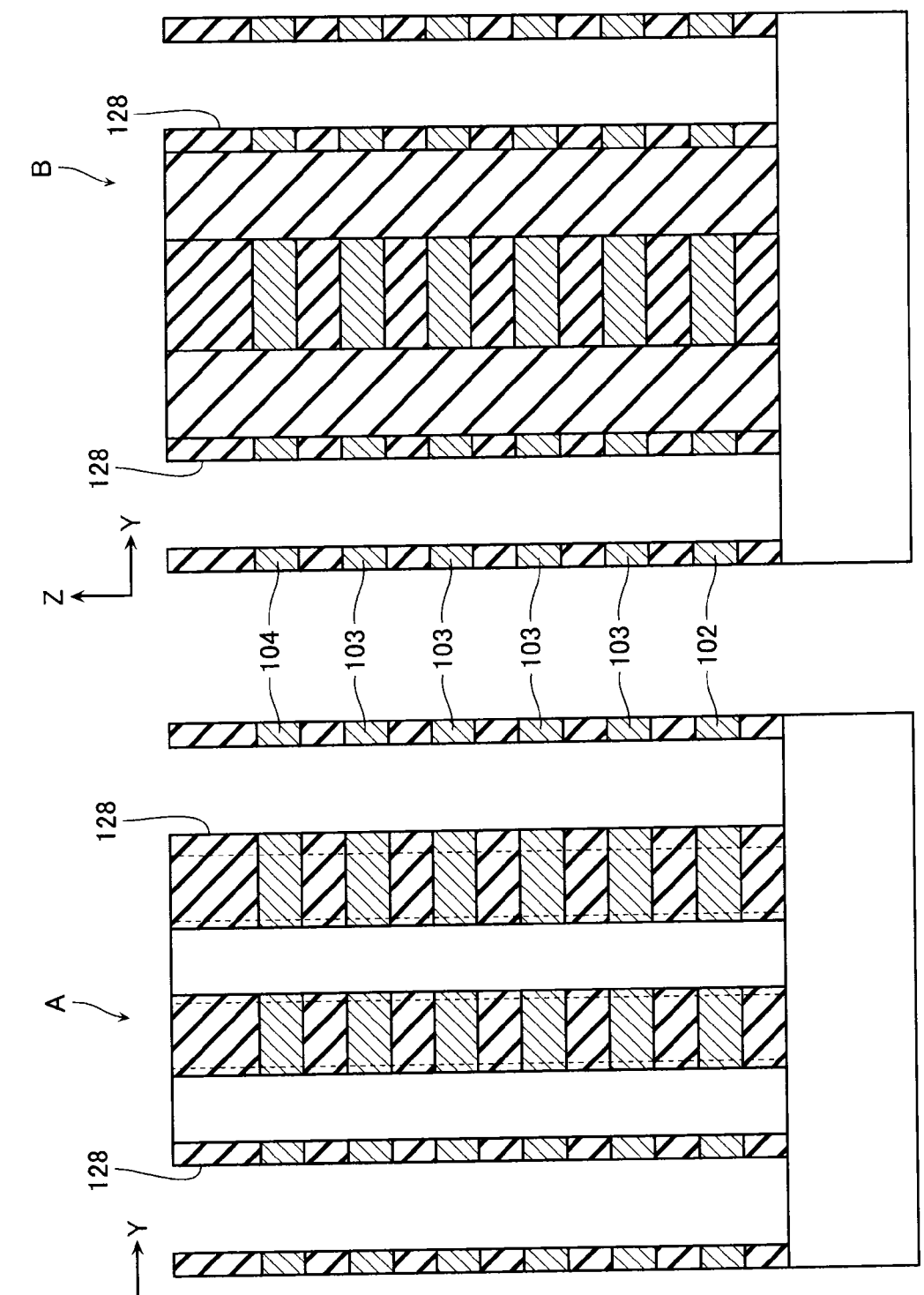
Figure 23:
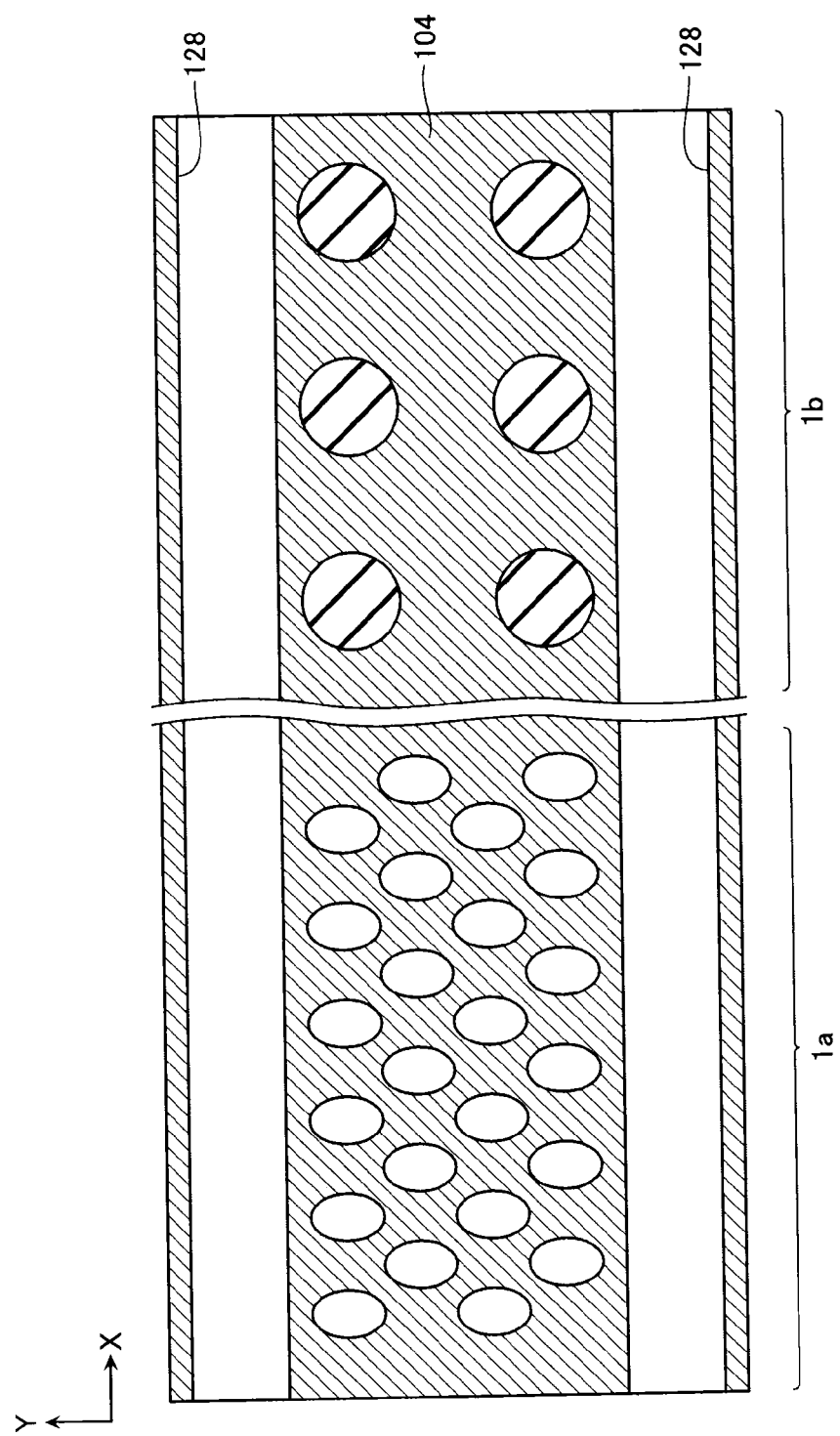

As shown in FIGS. 22 and 23, the conductive layers 102 to 104 are deposited in the gap 144 via the trench 128. Now, the conductive layers 102 to 104 are formed from, for example, tungsten (W). Finally, the insulating film 129 is deposited on a sidewall of the trench 128 and then the conductive layer 130 is deposited, whereby the memory cell array 1 having the structure shown in FIGS. 5 and 6 is formed.

That concludes the manufacturing steps of the memory cell array 1 of the present embodiment.

Next, advantages of the present embodiment will be described using a comparative example.

Figure 24:
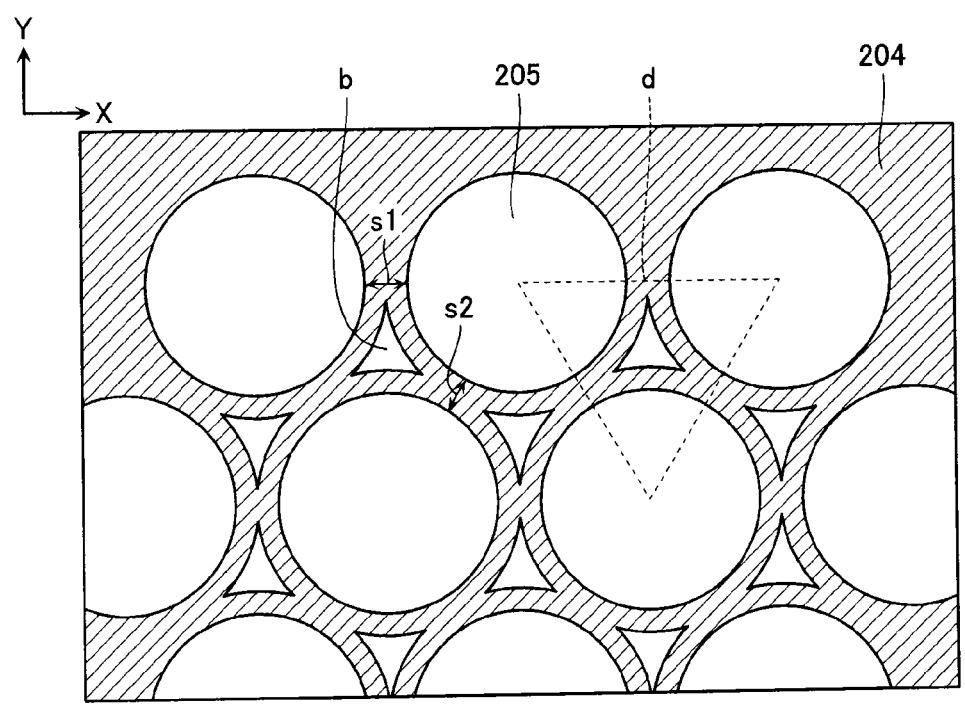
FIG. 24 is a cross-sectional view of a memory cell array in a semiconductor memory device according to a comparative example to the embodiment.

FIG. 24 is a cross-sectional view of a memory cell array in a semiconductor memory device according to a comparative example to the present embodiment. FIG. 24 is a cross-sectional view in the X-Y directions of a memory region of the memory cell array.

In the case of the comparative example, a plurality of memory columnar bodies 205 (corresponding to 105) are arranged staggered in the X direction and the Y direction, similarly to in the embodiment. Moreover, in the example of FIG. 24, similarly to in the example of FIG. 7, the memory columnar bodies 205 are arranged such that centers of three memory columnar bodies 205 adjacent to each other roughly configure an equilateral triangle as shown by the dashed lines d in FIGS. 7 and 24. However, in the case of the comparative example, contrary to the embodiment, each of the memory columnar bodies 205 has a cross-section in the X-Y directions of a circular shape having a diameter comparable with the length wy in the long axis direction of the memory columnar body 105. In this case, the spacings s1 and s2 between adjacent memory columnar bodies 205 end up being narrower than in the case of the embodiment. Therefore, when depositing conductive layers 202 to 204 (corresponding to 102 to 104) in a gap 244 (corresponding to 144) via a trench 228 (corresponding to 128) not illustrated, a gap between two memory columnar bodies 205 adjacent to each other gets filled. In this case, there is a risk that a conductive material of the conductive layers 202 to 204 does not reach a center portion between three memory columnar bodies 205 adjacent to each other, and that, as shown by b in FIG. 24, a void of substantially triangular shape gets generated. As a result, a wiring line resistance of the select gate lines SGS and SGD, and the word line WL, ends up increasing.

In this regard, shortening the length wx in the X direction of the memory columnar body 105 as in the present embodiment makes it possible secure a large gap between the memory columnar bodies 105 adjacent in the X direction. Moreover, because this gap is an outflow path of a sacrifice material during removal of the sacrifice layers 141 to 143 and is an inflow path of the conductive material during deposition of the conductive layers 102 to 104, removal of the sacrifice material between the memory columnar bodies 105 becomes easy, and the conductive material can more easily be made to penetrate between the memory columnar bodies 105. Therefore, a void occurring between the memory columnar bodies 105 can be made smaller compared to in the comparative example. As a result, it is possible to form select gate lines SGS and SGD, and a word line WL, whose wiring line resistances are small. Moreover, in the case of the present embodiment, because the length wy in the Y direction is formed large, processing is easier than when a cross-sectional shape of unchanged circular shape in the X-Y directions is made small.

Finally, several application examples of the present embodiment will be listed. Now, points of difference with the examples of FIGS. 5 to 7 will mainly be described.

Figure 25:
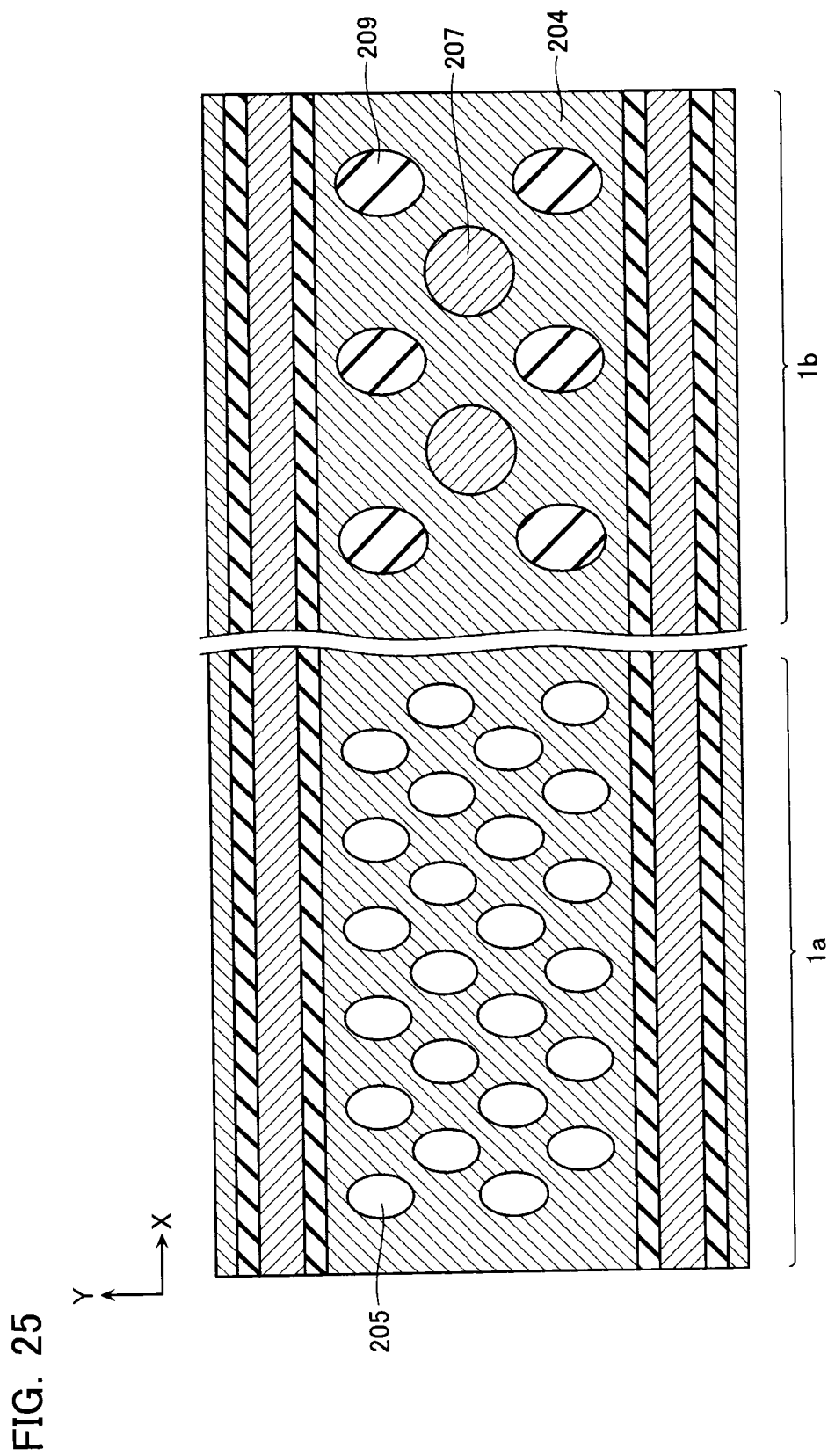
FIGS. 25 to 28 are other cross-sectional views of the memory cell array in the semiconductor memory device according to the embodiment.
Figure 26:
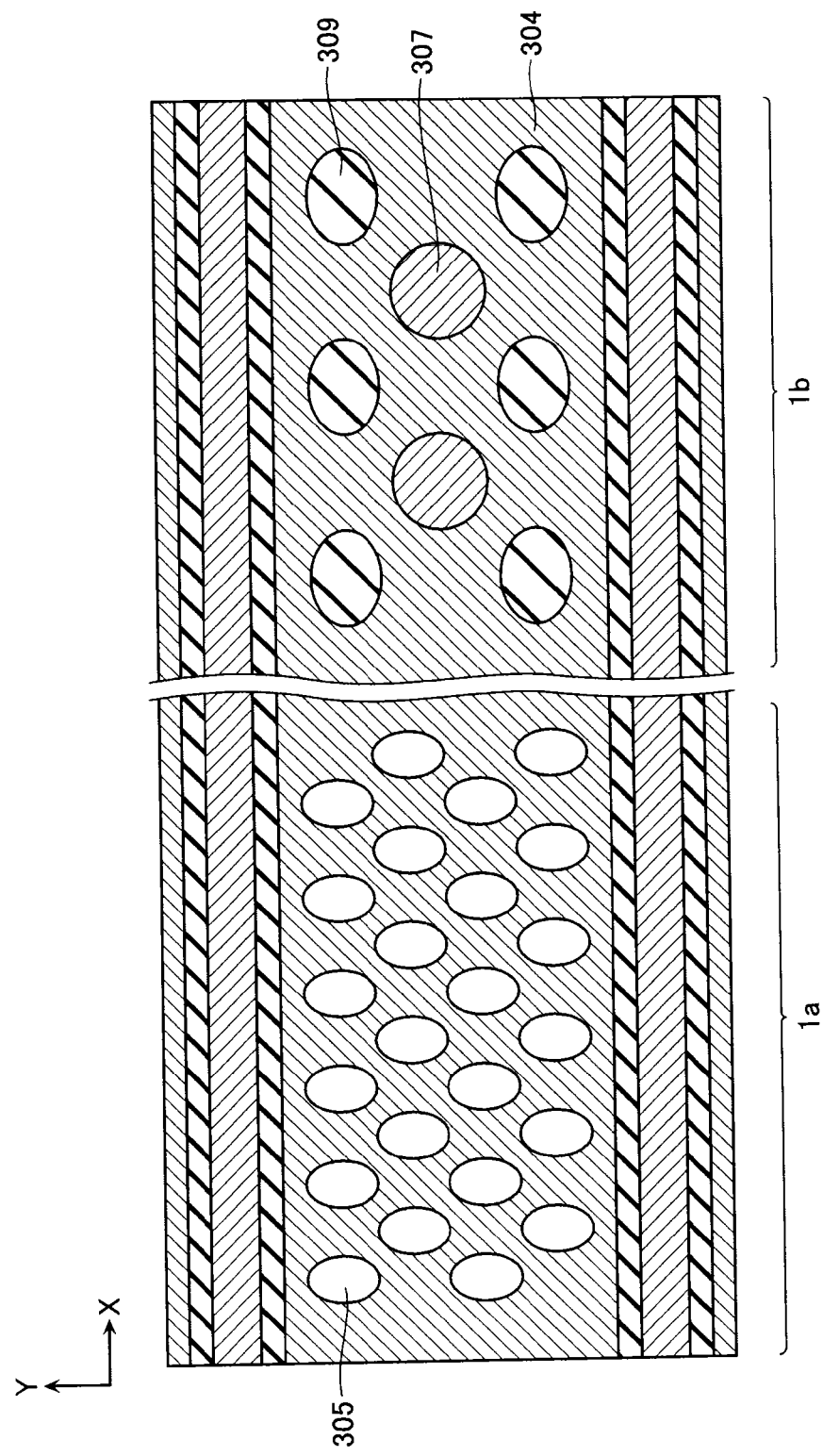
Figure 27:
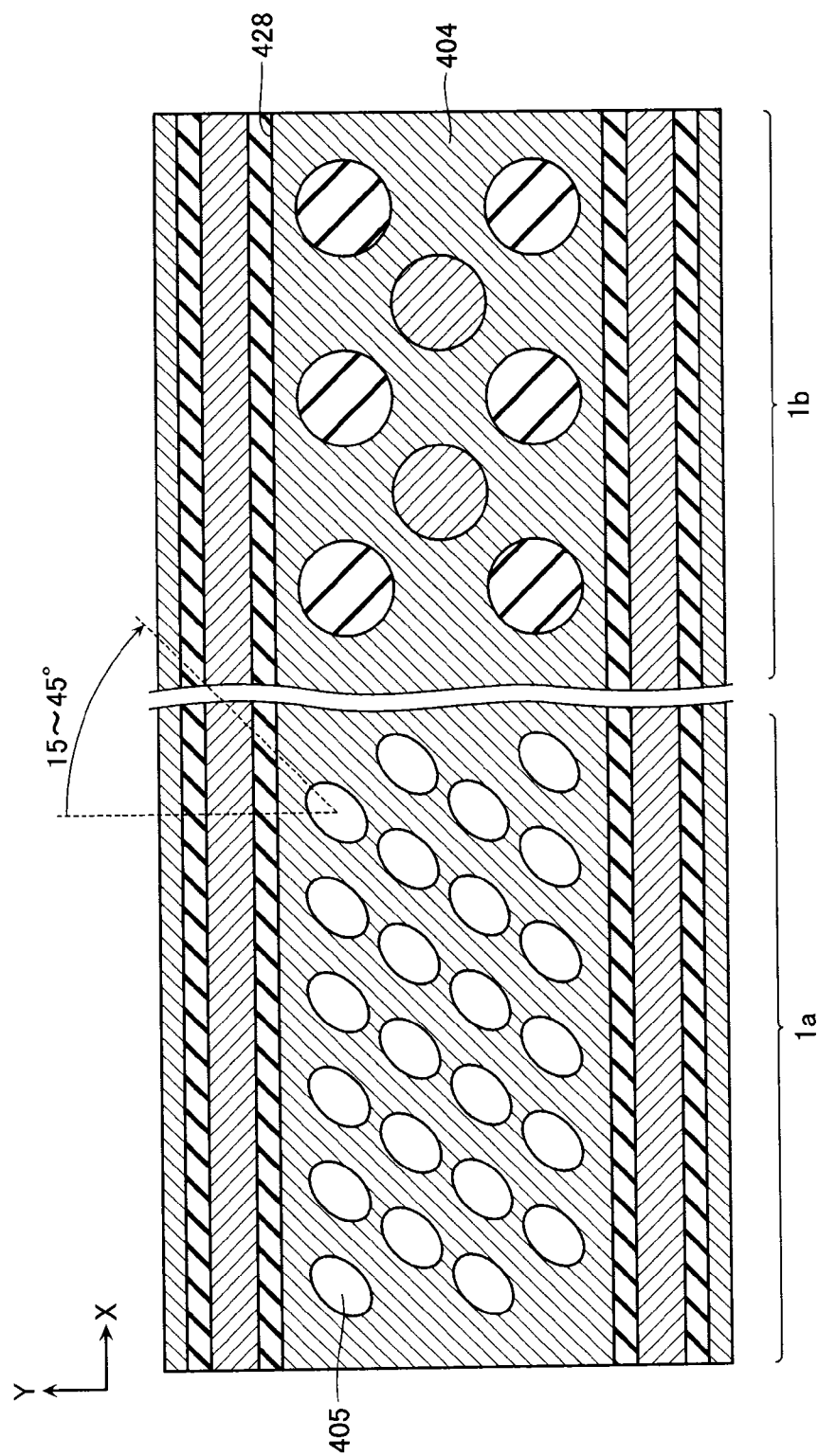
Figure 28:
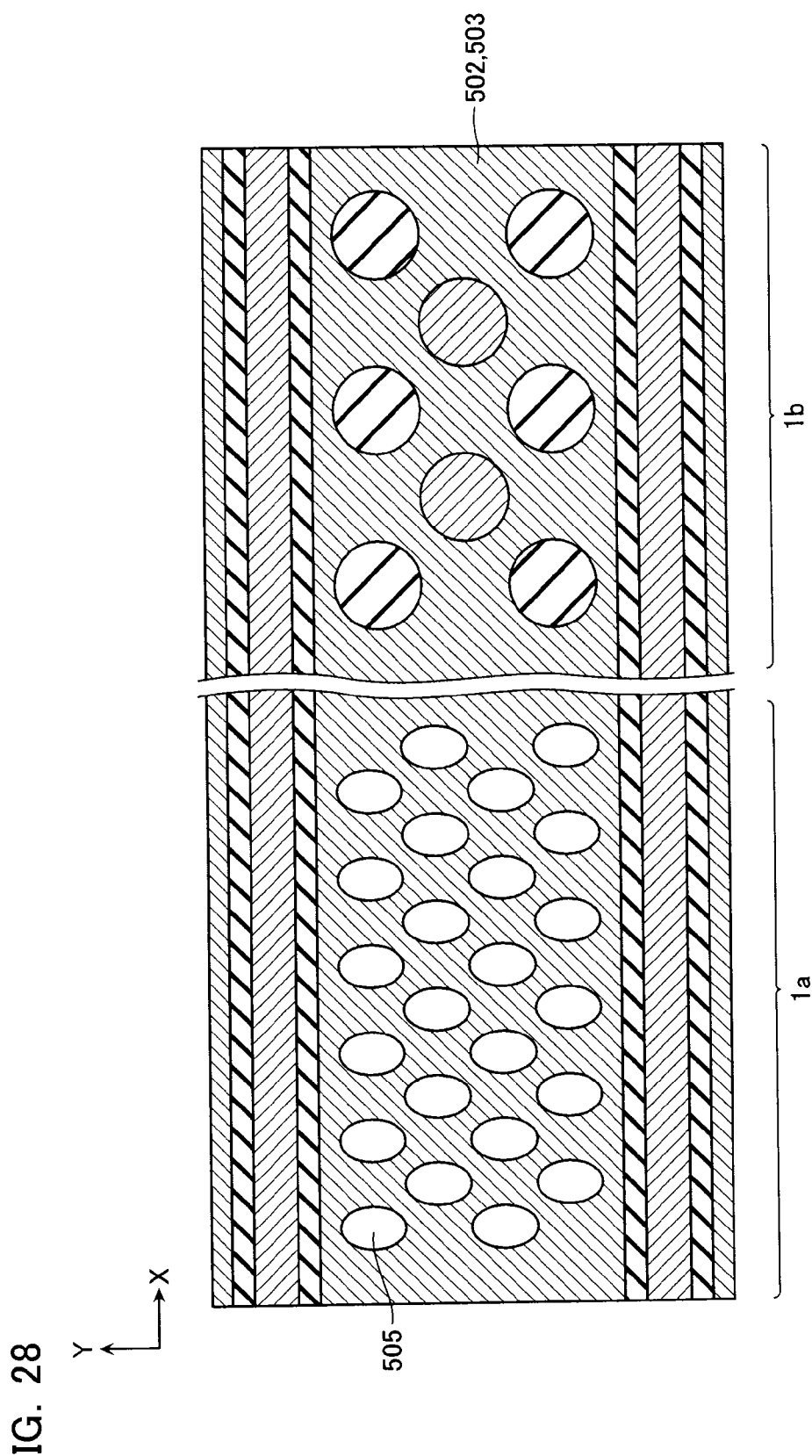

FIGS. 25 to 28 are other cross-sectional views of the memory cell array in the semiconductor memory device according to the embodiment. FIGS. 25 to 27 are cross-sectional views in the X-Y directions at positions of uppermost layer conductive layers 204, 304, or 404 in the Z direction. FIG. 28 is a cross-sectional view in the X-Y directions at positions of conductive layers 502 and 503 in the Z direction.

In the example of FIG. 25, not only a memory columnar body 205 (corresponding to 105), but also a beam columnar body 209 (corresponding to 109) has a cross-section in the X-Y directions of an oval shape having a long axis extending in the same direction as a long axis of a cross-section of the memory columnar body 205. Moreover, in the example of FIG. 26, a beam columnar body 309 (corresponding to 109) has a cross-section in the X-Y directions of an oval shape having a long axis extending in a direction intersecting a long axis of a cross-section of a memory columnar body 305 (corresponding to 105). In either case, it becomes easier for a conductive material of conductive layers 202 to 204 or 302 to 304 (corresponding to 102 to 104) to penetrate, also in the contact region 1b, hence it is possible to suppress an increase in contact resistance between a via 207 or 307 (corresponding to 107) and the select gate lines SGS and SGD, and the word line WL.

The example of FIG. 27 is an example where a long axis direction of a memory columnar body 405 (corresponding to 105) is inclined at 15 to 45° to a direction orthogonal to an extension direction of a trench 428 (corresponding to 128). Even in this case, a spacing which is to a certain extent large can be secured between memory columnar bodies 405 adjacent in the X direction which is a main inflow path of a conductive material of conductive layers 402 to 404 (corresponding to 102 to 104), hence even in this example, it is possible to form select gate lines SGS and SGD, and a word line WL, whose wiring line resistances are small.

The example of FIG. 28 is an example where a cross-section in the X-Y directions of a memory columnar body 505 (corresponding to 105) is configured in an oval shape at positions of conductive layers 502 or 503 other than an uppermost layer conductive layer 504 (corresponding to 104). Similar advantages to those of the above-described examples can be obtained even at positions of the conductive layers 502 and 503 different from the uppermost layer conductive layer 504, as in this example.

As described above, the present embodiment, by having a cross-section in the X-Y directions of a memory columnar body formed in an oval shape where an inclination intersecting an extension direction of a trench is a long axis direction, makes it possible to provide a semiconductor memory device having select gate lines and a word line whose wiring line resistances are low.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   when three directions orthogonal to each other are assumed to be first through third directions,
   a memory cell array including: a conductive layer stacked in the third direction above a semiconductor substrate; and a first columnar body penetrating the conductive layer in the third direction and including a semiconductor film,
   the conductive layer having a side surface facing the second direction, and
   the first columnar body having a cross-section along the first and second directions in which, at a first position which is a certain position in the third direction, a length in the first direction is shorter than a length in the second direction.

2. The semiconductor memory device according to claim 1, wherein
the first columnar body has the cross-section in which, at the first position, the length in the second direction is 1.3 or more times the length in the first direction.

3. The semiconductor memory device according to claim 1, wherein
the memory cell array has a first region in which the first columnar body is disposed, and a second region aligned in the first direction with the first region,
the memory cell array includes a second columnar body penetrating the conductive layer in the third direction in the second region, and
the second columnar body has a cross-section along the first and second directions in which, at the first position, the length in the first direction is shorter than the length in the second direction.

4. The semiconductor memory device according to claim 1, wherein
the memory cell array has a first region in which the first columnar body is disposed, and a second region aligned in the first direction with the first region,
the memory cell array includes a second columnar body penetrating the conductive layer in the third direction, and
the second columnar body has a cross-section along the first and second directions in which, at the first position, the length in the first direction is longer than the length in the second direction.

5. The semiconductor memory device according to claim 1, wherein
the memory cell array has a first region in which the first columnar body is disposed, and a second region aligned in the first direction with the first region,
the memory cell array includes a second columnar body penetrating the conductive layer in the third direction in the second region, and
the second columnar body has a cross-section along the first and second directions which, at the first position, has a substantially circular shape.

6. The semiconductor memory device according to claim 1, wherein
the first columnar body includes a tunnel insulating film and a charge accumulation film disposed between the semiconductor film and the conductive layer.

7. The semiconductor memory device according to claim 1, wherein
the conductive layer adopts tungsten (W) as a material.

8. The semiconductor memory device according to claim 1, wherein
the memory cell array includes a plurality of the conductive layers stacked in the third direction above the semiconductor substrate, via an inter-layer insulating layer.

9. A semiconductor memory device, comprising:
when three directions orthogonal to each other are assumed to be first through third directions,
a memory cell array including: a conductive layer stacked in the third direction above a semiconductor substrate; and a plurality of first columnar bodies penetrating the conductive layer in the third direction and including a semiconductor film,
the conductive layer having a side surface facing the second direction,
the first columnar body having a cross-section along the first and second directions in which, at a first position which is a certain position in the third direction, a length in the first direction is shorter than a length in the second direction,
the plurality of first columnar bodies including: a third columnar body; a fourth columnar body aligned in the first direction with the third columnar body; and a fifth columnar body disposed in between the third and fourth columnar bodies in the first direction and disposed at a different position to the third and fourth columnar bodies in the second direction, and
at a first position which is a certain position in the third direction, a spacing between the third and fourth columnar bodies being longer than a spacing between the third and fifth columnar bodies.

10. The semiconductor memory device according to claim 9, wherein
at the first position, the spacing between the third and fourth columnar bodies is two or more times the spacing between the third and fifth columnar bodies.

11. The semiconductor memory device according to claim 9, wherein
the plurality of first columnar bodies each include a tunnel insulating film and a charge accumulation film disposed between the semiconductor film and the conductive layer.

12. A semiconductor memory device, comprising:
when three directions orthogonal to each other are assumed to be first through third directions,
a memory cell array including: a conductive layer stacked in the third direction above a semiconductor substrate; and a first columnar body penetrating the conductive layer in the third direction and including a semiconductor film,
the conductive layer having a side surface facing the second direction, and
the first columnar body having a cross-section along the first and second directions which, at a first position which is a certain position in the third direction, has an oval shape having a long axis along the second direction.

13. The semiconductor memory device according to claim 12, wherein
the first columnar body has the cross-section in which, at the first position, a length of a long axis is 1.3 or more times a length of a short axis.

14. The semiconductor memory device according to claim 12, wherein
the memory cell array has a first region in which the first columnar body is disposed, and a second region aligned in the first direction with the first region,
the memory cell array includes a second columnar body penetrating the conductive layer in the third direction in the second region, and
the second columnar body has a cross-section along the first and second directions which, at the first position, has the oval shape having a long axis along the second direction.

15. The semiconductor memory device according to claim 12, wherein
the memory cell array has a first region in which the first columnar body is disposed, and a second region aligned in the first direction with the first region,
the memory cell array includes a second columnar body penetrating the conductive layer in the third direction in the second region, and the second columnar body has a cross-section along the first and second directions which, at the first position, has the oval shape having a long axis along the first direction.

\* \* \* \* \*